United States Patent
Bessho et al.

(10) Patent No.: US 7,773,654 B2
(45) Date of Patent: Aug. 10, 2010

(54) SEMICONDUCTOR LASER APPARATUS AND FABRICATION METHOD THEREOF

(75) Inventors: Yasuyuki Bessho, Hirakata (JP); Masayuki Hata, Kadoma (JP); Daijiro Inoue, Kyoto (JP); Tsutomu Yamaguchi, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 212 days.

(21) Appl. No.: 11/092,947

(22) Filed: Mar. 30, 2005

(65) Prior Publication Data
US 2005/0220159 A1 Oct. 6, 2005

(30) Foreign Application Priority Data
Mar. 30, 2004 (JP) .............................. 2004-101487
Feb. 21, 2005 (JP) .............................. 2005-043388

(51) Int. Cl.
*H01S 5/00* (2006.01)
(52) U.S. Cl. .............................. 372/50.122; 372/50.12; 372/50.121
(58) Field of Classification Search .............. 372/50.12, 372/50.121, 50.122
See application file for complete search history.

(56) References Cited

U.S. PATENT DOCUMENTS

| | | | |
|---|---|---|---|
| 4,916,710 A * | 4/1990 | Hattori | ................... 372/50.121 |
| 5,228,050 A | 7/1993 | LaCourse et al. | |
| 6,136,623 A * | 10/2000 | Hofstetter et al. | ............. 438/28 |
| 6,643,310 B2 | 11/2003 | Nemoto | |
| 6,748,001 B1 * | 6/2004 | Nishitsuka et al. | ....... 372/43.01 |
| 2001/0048703 A1 * | 12/2001 | Oh | ................................ 372/43 |
| 2001/0050531 A1 * | 12/2001 | Ikeda | .......................... 313/498 |
| 2001/0050933 A1 | 12/2001 | Takahashi et al. | |

(Continued)

FOREIGN PATENT DOCUMENTS

JP   08-046280   2/1996

(Continued)

OTHER PUBLICATIONS

Hashizu et al., "Three-wavelength Laser Diodes for Optical Disc System", Digest of Technical Papers, Jan. 2005.*

(Continued)

*Primary Examiner*—Minsun Harvey
*Assistant Examiner*—Joshua King
(74) *Attorney, Agent, or Firm*—McDermott Will & Emery LLP

(57) ABSTRACT

A blue-violet semiconductor laser device has a first p-electrode formed on its upper surface and a first n-electrode formed on its lower surface. A red semiconductor laser device has a second n-electrode formed on its upper surface and a second p-electrode formed on its lower surface. An infrared semiconductor laser device has a third n-electrode formed on its upper surface and a third p-electrode formed on its lower surface. Solder films are partially formed on the upper surface of the first p-electrode in the blue-violet semiconductor laser device. Two of the solder films are formed with a predetermined distance between them on the upper surface of the first p-electrode. This results in a portion of the first p-electrode being exposed. The first, second and third p-electrodes of the blue-violet semiconductor laser device, red semiconductor laser device, and infrared semiconductor laser device are common electrodes.

17 Claims, 25 Drawing Sheets

U.S. PATENT DOCUMENTS

| | | | |
|---|---|---|---|
| 2002/0097773 A1* | 7/2002 | Masui et al. | 372/109 |
| 2003/0160251 A1* | 8/2003 | Wanlass et al. | 257/80 |
| 2003/0214616 A1* | 11/2003 | Komoto et al. | 349/96 |
| 2004/0109481 A1 | 6/2004 | Ikeda | |
| 2004/0136428 A1* | 7/2004 | Miyachi et al. | 372/50 |
| 2004/0184502 A1 | 9/2004 | Miyachi et al. | |
| 2005/0082550 A1 | 4/2005 | Hamaoka et al. | |
| 2005/0218420 A1* | 10/2005 | Bessho et al. | 257/99 |
| 2005/0232322 A1 | 10/2005 | Bessho et al. | |
| 2005/0242361 A1* | 11/2005 | Bessho et al. | 257/99 |
| 2006/0045156 A1 | 3/2006 | Hata et al. | |
| 2009/0097523 A1 | 4/2009 | Bessho et al. | |
| 2009/0238230 A1 | 9/2009 | Bessho et al. | |

FOREIGN PATENT DOCUMENTS

| | | |
|---|---|---|
| JP | 11-112091 | 4/1999 |
| JP | 2000294878 A * | 10/2000 |
| JP | 2001-229570 | 8/2001 |
| JP | 2001-230502 | 8/2001 |
| JP | 2002-118331 | 4/2002 |
| JP | 2002118331 A * | 4/2002 |
| JP | 2002-232077 | 8/2002 |
| JP | 2004-119580 | 4/2004 |
| JP | 2005-317896 | 11/2005 |
| JP | 2006-128602 | 5/2006 |

OTHER PUBLICATIONS

U.S. Appl. No. 11/093,024, filed Mar. 30, 2005, Yasuyuki Bessho, et al.

U.S. Appl. No. 11/078,626, filed Mar. 14, 2005, Yasuyuki Bessho, et al.

U.S. Appl. No. 11/076,963, filed Mar. 11, 2005, Yasuyuki Bessho, et al.

U.S. Appl. No. 11/081,726, filed Mar. 17, 2005, Yasuyuki Bessho, et al.

Chinese Office Action, with English Translation, issued in corresponding Chinese Patent Application No. 2005100588419, dated on Jan. 18, 2008.

United States Office Action issued in U.S. Appl. No. 11/215,066, mailed Dec. 18, 2007.

Japanese Office Action, with English translation, issued in Japanese Patent Application No. 2005-043388, mailed Jan. 26, 2010.

* cited by examiner

FIG. 4
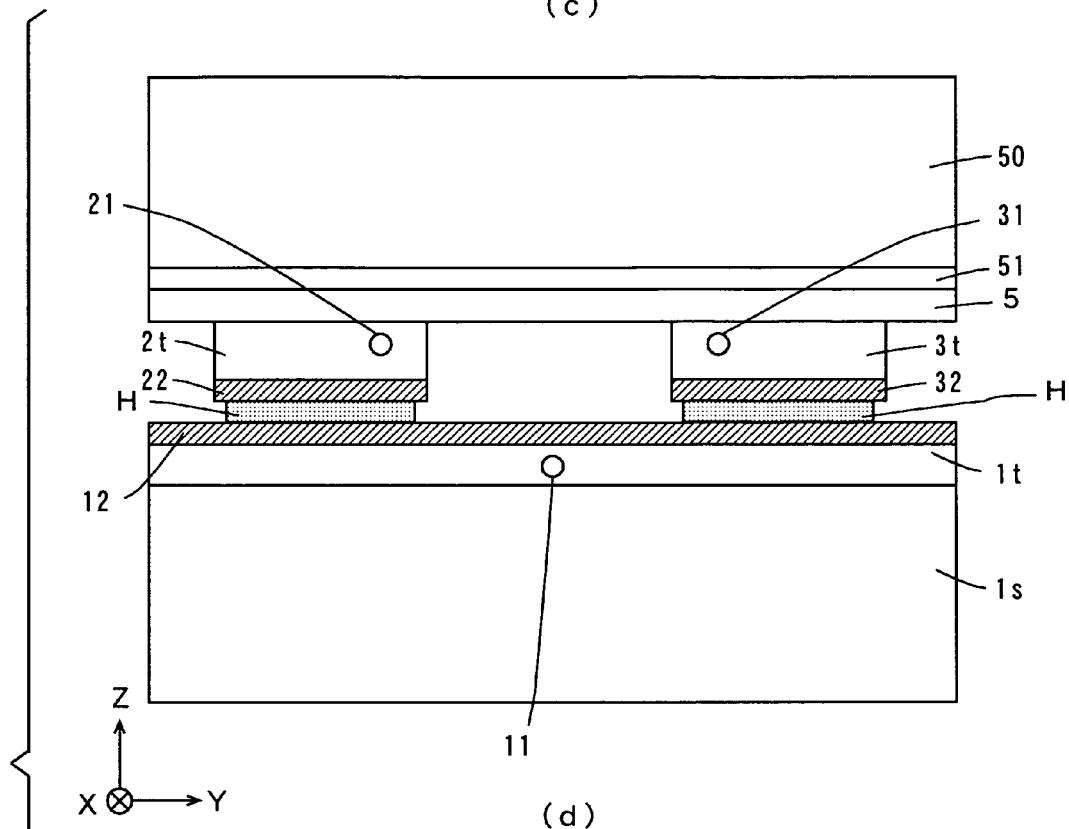
(c)
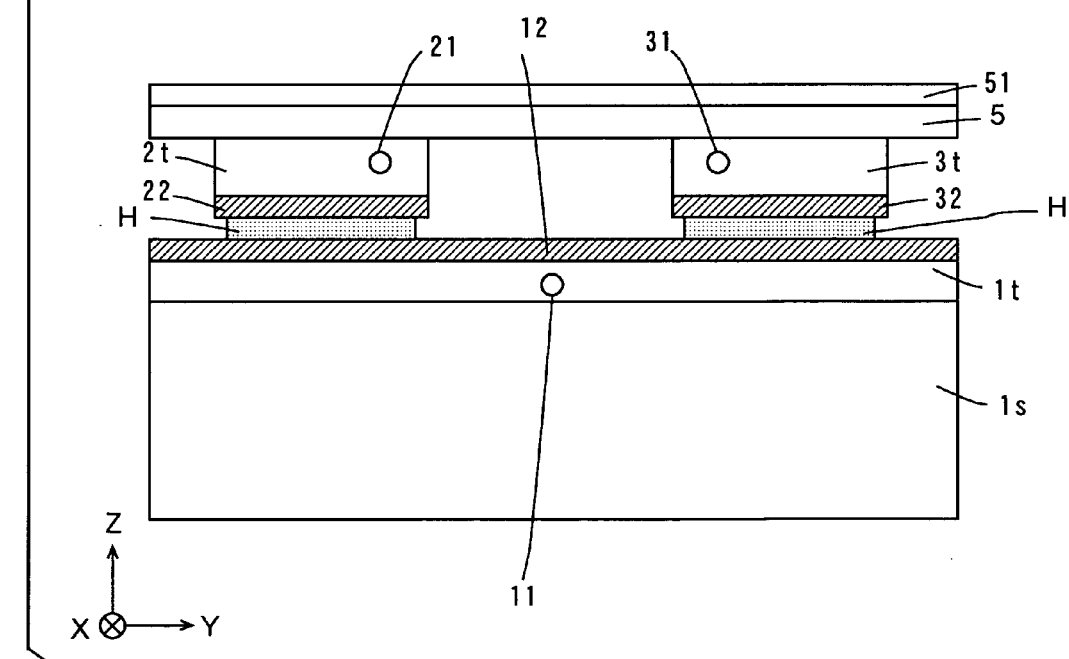
(d)

(g)

F I G. 1 0
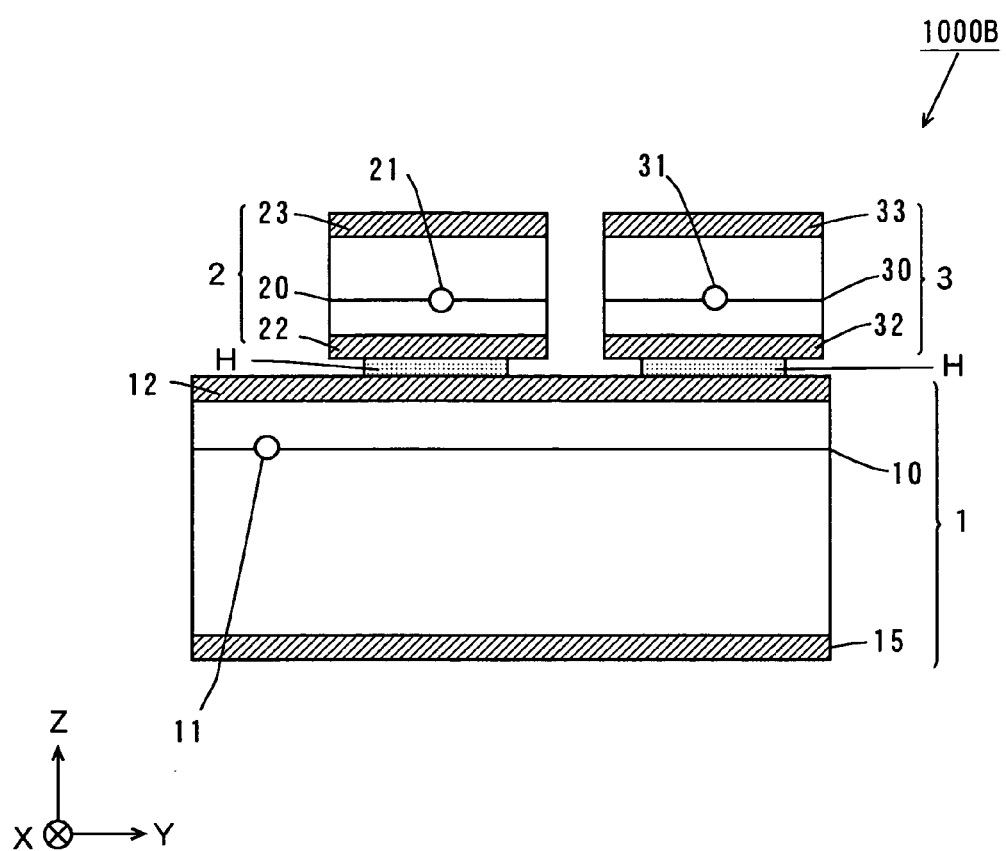

FIG. 11
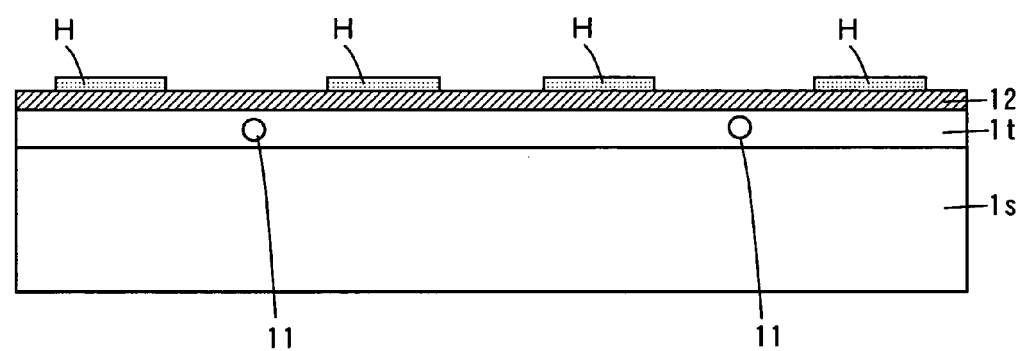
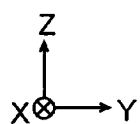

F I G. 1 2
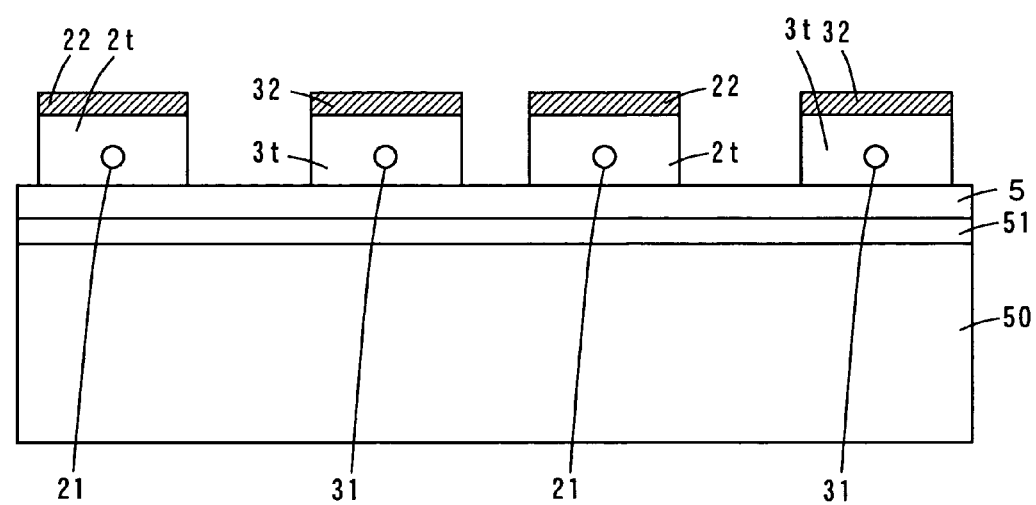
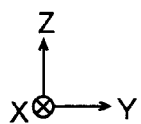

FIG. 13
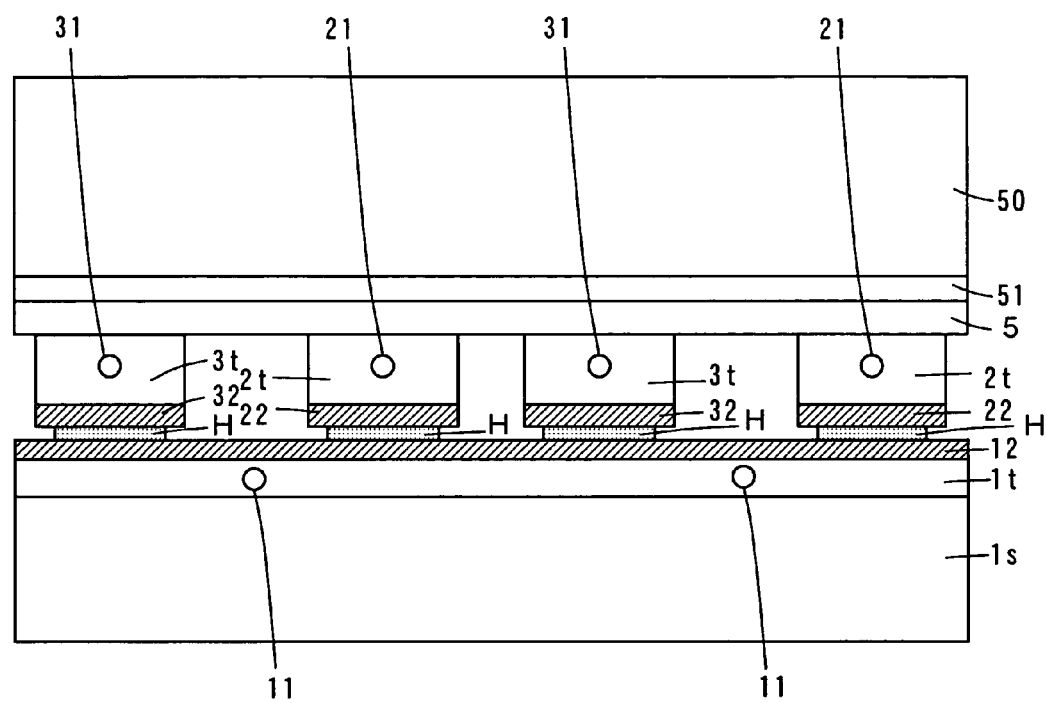
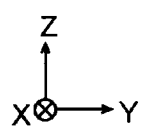

FIG. 14
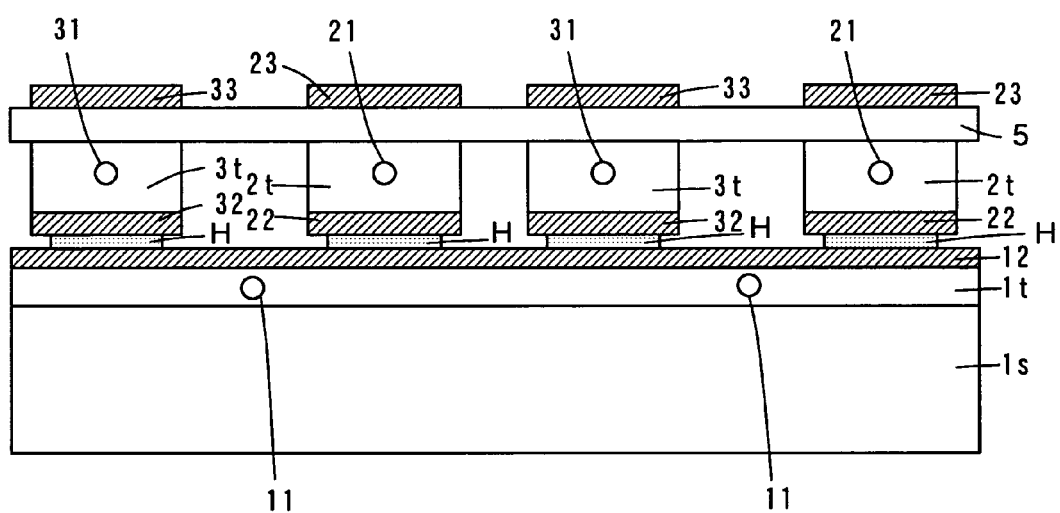
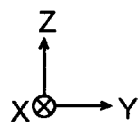

FIG. 15
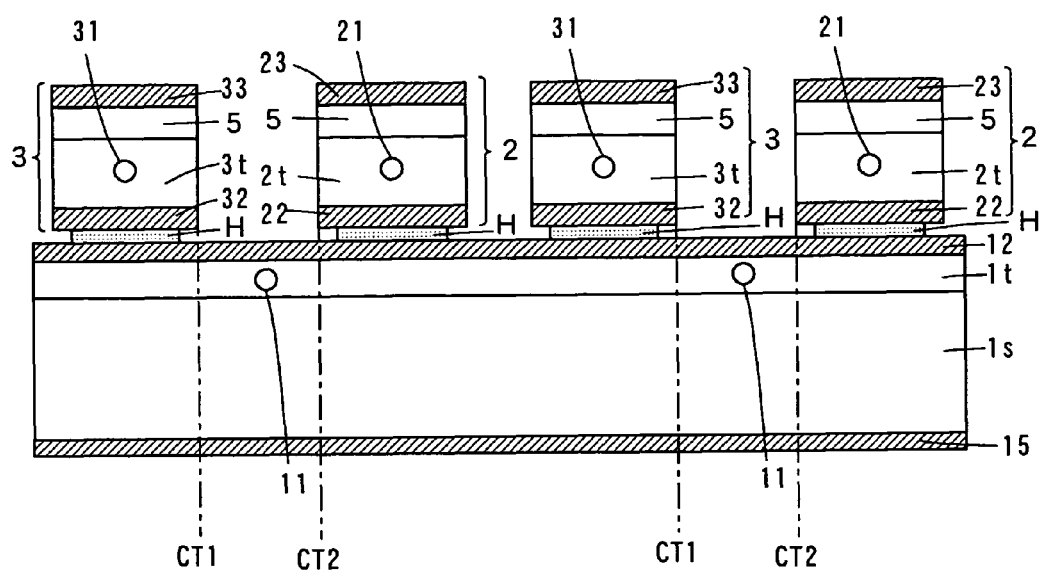
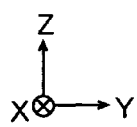

FIG. 21
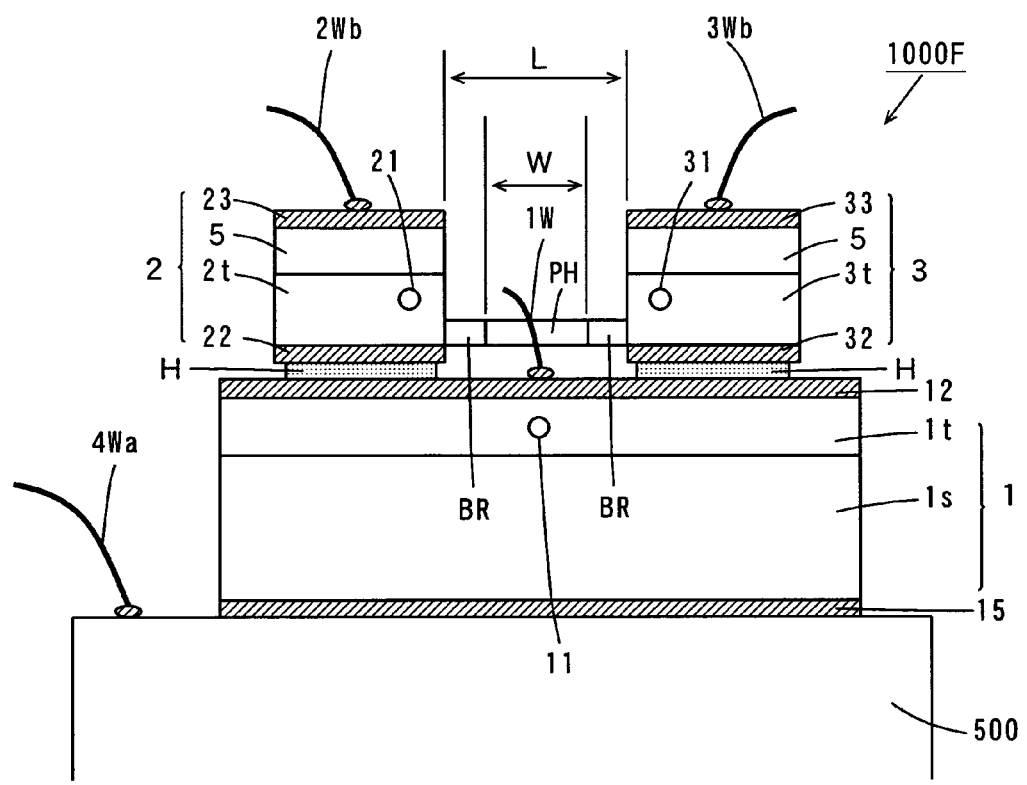
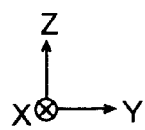

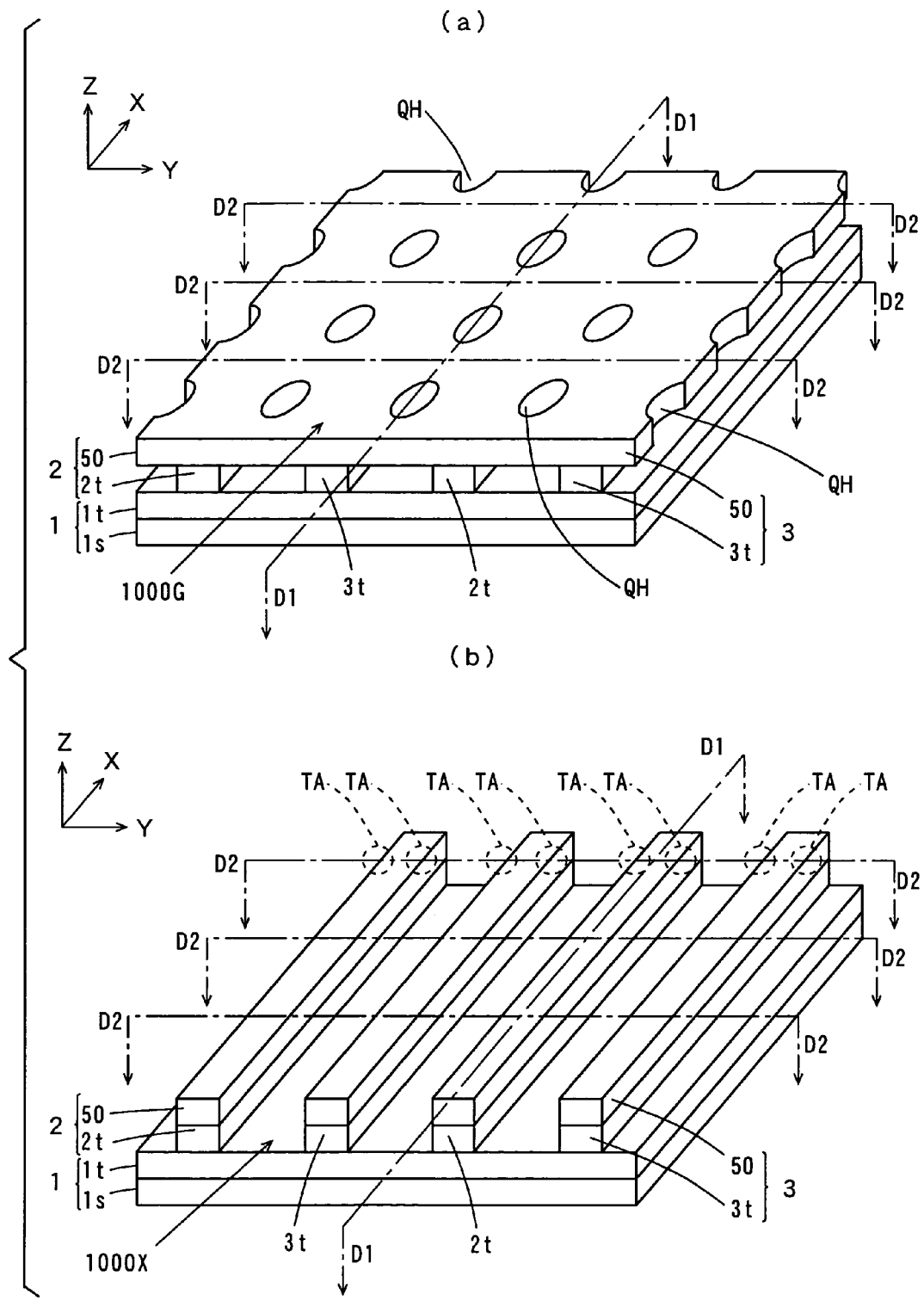

SEMICONDUCTOR LASER APPARATUS AND FABRICATION METHOD THEREOF

BACKGROUND OF THE INVENTION

1. Field of the Invention

The present invention relates to a semiconductor laser apparatus capable of emitting a plurality of light beams having different wavelengths and a fabrication method thereof.

2. Description of the Background Art

Conventionally, CD (Compact Disk)/CD-R (Compact Disk-Recordable) drives have employed semiconductor laser devices which emit infrared beams of light with a wavelength of approximately 780 nm (infrared semiconductor laser devices) as light sources. Conventional DVD (Digital Versatile Disk) drives, on the other hand, have employed semiconductor laser devices which emit red beams of light with a wavelength of approximately 650 nm (red semiconductor laser devices) as light sources.

Meanwhile, the development of DVDs is recently progressing which can be recorded and played back using blue-violet beams of light with a wavelength of approximately 405 nm. In order to record and play back such DVDs, the development of DVD drives using semiconductor laser devices which emit blue-violet beams of light with a wavelength of approximately 405 nm (blue-violet semiconductor laser devices) is simultaneously progressing. Such DVD drives require compatibility with conventional CDs/CD-Rs and DVDs.

In this case, compatibility with conventional CDs, DVDs, and new DVDs is achieved using a method of providing a DVD drive with a plurality of optical pickup apparatuses which emit infrared, red, and blue-violet beams, respectively, or a method of providing an infrared semiconductor laser device, red semiconductor laser device, and blue-violet semiconductor laser device in one optical pickup apparatus. The above-described methods, however, result in an increase in parts count, thus making it difficult to make a smaller, simpler, and lower-cost DVD drive.

In order to prevent such an increase in the parts counts, semiconductor laser devices each comprised of an infrared semiconductor laser device and a red semiconductor laser device integrated into a single chip are in practical use.

The infrared semiconductor laser device and red semiconductor laser device, which are both formed on a GaAs substrate, can be formed into a single chip. The blue-violet semiconductor laser device, however, is not formed on a GaAs substrate, which makes it very difficult to be integrated into a single chip together with the infrared and red semiconductor laser devices.

JP 2001-230502 A suggests a light emitting device to overcome such difficulties. This light emitting device is obtained as follows: an infrared semiconductor laser device and a red semiconductor laser device are formed on the same chip to fabricate a monolithic red/infrared semiconductor laser device; simultaneously, a blue-violet semiconductor laser device is formed on a different chip; after this, the chip of the blue-violet semiconductor laser device and the chip of the monolithic red/infrared semiconductor laser device are laminated.

In the above-described light emitting device, however, the red semiconductor laser device and infrared semiconductor laser device are formed on a common n-type substrate due to the structure of the monolithic red/infrared semiconductor laser device. The p-side electrodes of the infrared semiconductor laser device and red semiconductor laser device are mounted on the n-type substrate of the blue-violet semiconductor laser device. Such a structure results in limited space for connecting a wire that is attached to each electrode. This makes wiring of the light emitting device complicated.

SUMMARY OF THE INVENTION

An object of the present invention is to provide a semiconductor laser apparatus and a fabrication method thereof comprising a plurality of semiconductor laser devices with increased flexibility in wiring each electrode of the plurality of semiconductor laser devices.

According to one aspect of the present invention, there is provided a semiconductor laser apparatus comprising: a first semiconductor laser device having on a first substrate a first semiconductor layer that emits a light beam having a first wavelength; a second semiconductor laser device having on a second substrate a second semiconductor layer that emits a light beam having a second wavelength; and a third semiconductor laser device having on a third substrate a third semiconductor layer that emits a light beam having a third wavelength, at least one of the first, second, and third wavelengths being different from another wavelength, the first semiconductor laser device having a first electrode on a first surface side, the second semiconductor laser device and the third semiconductor laser device being bonded to the first surface side of the first semiconductor laser device such that at least a portion of the first electrode is exposed.

In the semiconductor laser apparatus, the at least a portion of the first electrode of the first semiconductor laser device is exposed on a surface where the first semiconductor laser device is bonded with the second and third semiconductor laser devices. Therefore, the first electrode of the first semiconductor laser device can be easily wired.

Moreover, the second semiconductor laser device and third semiconductor laser device are bonded to the first surface side of the first semiconductor laser device, so that the second and third semiconductor laser devices can be easily wired from the same side as the first surface side of the first semiconductor laser device.

This results in improved flexibility in wiring the first, second, and third semiconductor laser devices.

At least either of the second or third substrates may be made of a material different from that of the first substrate. In this case, the semiconductor laser devices including different substrates are integrally formed.

The second semiconductor laser device and the third semiconductor laser device may be bonded to the first surface side of the first semiconductor laser device such that at least a portion of the first electrode of the first semiconductor laser device is exposed between the second semiconductor laser device and the third semiconductor laser device.

In this case, the first electrode of the first semiconductor laser can be easily wired through the spacing between the second semiconductor laser device and the third semiconductor laser device.

The second semiconductor laser device and the third semiconductor laser device may be bonded to the first surface side of the first semiconductor laser device such that at least a portion of the first electrode of the first semiconductor laser device is exposed either on a side of the second semiconductor laser device opposite to the third semiconductor laser device or on a side of the third semiconductor laser device opposite to the second semiconductor laser device.

In this case, the first electrode of the first semiconductor laser device is easily wired either from the side of the second semiconductor laser device opposite to the third semiconductor laser device or from the side of the third semiconductor laser device opposite to the second semiconductor laser device.

The first electrode may be formed on the first semiconductor layer, the second semiconductor laser device may have a second electrode on a surface opposite to a junction with the first semiconductor laser device, and the third semiconductor laser device may have a third electrode on a surface opposite to a junction with the first semiconductor laser device.

The first electrode may be formed on the first substrate, the second semiconductor laser device may have a second electrode on a surface opposite to a junction with the first semiconductor laser device, and the third semiconductor laser device may have a third electrode on a surface opposite to a junction with the first semiconductor laser device.

In this case, the second electrode of the second semiconductor laser device is positioned on the surface opposite to the junction with the first semiconductor laser device, while the third electrode of the third semiconductor laser device is positioned on the surface opposite to the junction with the first semiconductor laser device. This allows the first, second, and third electrodes of the corresponding first, second, and third semiconductor laser devices to be wired from the direction of one surface of the semiconductor laser apparatus. This facilitates fabrication of the semiconductor laser apparatus.

The second electrode of the second semiconductor laser device may be formed on the second substrate, the third electrode of the third semiconductor laser device may be formed on the third substrate, and the second semiconductor layer of the second semiconductor laser device and the third semiconductor layer of the third semiconductor laser device may be bonded to the first surface side of the first semiconductor laser device.

In this case, the second semiconductor layer of the second semiconductor laser device and the third semiconductor layer of the third semiconductor laser device are bonded closer to the first surface side of the first semiconductor laser device.

In this manner, the first, second, and third semiconductor layers of the corresponding first, second, and third semiconductor laser devices are positioned closer to one another, resulting in a reduced distance among the emission points of the first, second, and third semiconductor laser devices. This allows all of the emission points of the first, second, and third semiconductor laser devices to approach the center of the semiconductor laser apparatus. Consequently, the first, second, and third semiconductor laser devices are improved in light extraction efficiency when converging the laser beams through a lens, for example.

The first semiconductor laser device may further have a fourth electrode on the first semiconductor layer or the first substrate, the second semiconductor laser device may further have a fifth electrode on the second semiconductor layer, the third semiconductor laser device may further have a sixth electrode on the third semiconductor layer, and the fifth electrode of the second semiconductor laser device and the sixth electrode of the third semiconductor laser device may be electrically connected to the first electrode of the first semiconductor laser device.

In this case, the wiring of the first, second, and third semiconductor laser devices can be reduced by the electrical connection of the fifth electrode of the second semiconductor laser device and the sixth electrode of the third semiconductor laser device to the first electrode of the first semiconductor laser device. This simplifies the wiring of the semiconductor laser apparatus while requiring less time and effort.

The first semiconductor laser device may further have a fourth electrode on the first semiconductor layer or the first substrate, the second semiconductor laser device may further have a fifth electrode on the second semiconductor layer, the third semiconductor laser device may further have a sixth electrode on the third semiconductor layer, and the fifth electrode of the second semiconductor laser device and the sixth electrode of the third semiconductor laser device may be bonded to the first electrode of the first semiconductor laser device via an insulating layer, so that the first, fifth, and sixth electrodes are electrically isolated from one another.

In this case, an arbitrary voltage can be applied to each of the first, fifth, and sixth electrodes by the electrical isolation of the first, fifth, and sixth electrodes from one another. Consequently, arbitral selection of a driving system for each of the first, second, and third semiconductor laser devices is possible.

The first semiconductor laser device may further have a difference in level formed by an upper level surface and a lower level surface, the first electrode of the first semiconductor laser device may be formed over the upper level surface and the lower level surface, and the second semiconductor laser device and the third semiconductor laser device may be bonded onto the first electrode on the lower level surface of the first semiconductor laser device.

In the case where the first semiconductor layer has the upper step surface and lower step surface, the first semiconductor layer of the first semiconductor laser device, the second semiconductor layer of the second semiconductor laser device, and the third semiconductor layer of the third semiconductor laser device are arranged in alignment. This allows the emission points of the first, second, and third semiconductor laser devices to align on an almost straight line. This facilitates the designs of the semiconductor laser apparatus and an optical pick up apparatus therefor.

The second semiconductor layer of the second semiconductor laser device and the third semiconductor layer of the third semiconductor laser device are arranged in alignment even when the first substrate has an upper step surface and a lower step surface. This allows the emission points of the second and third semiconductor laser devices to align on an almost straight line. This facilitates the designs of the semiconductor laser apparatus and an optical pick up apparatus therefor.

The second semiconductor laser device and the third semiconductor laser device may be isolated from each other such that at least a portion of the first electrode is exposed. In this case, the first electrode of the first semiconductor laser device can be easily wired through the exposed portion between the second semiconductor laser device and the third semiconductor laser device.

The second semiconductor laser device and the third semiconductor laser device may include a connected portion, through which the second semiconductor laser device and the third semiconductor laser device are connected with each other, and the connected portion may have an aperture such that at least a portion of the first electrode of the first semiconductor laser device is exposed.

In this case, the first electrode of the first semiconductor laser device can be easily wired through the aperture of the connected portion.

In the case where the second and third substrates correspond to the connected portion, the connected portion between the second semiconductor laser device and the third semiconductor laser device forms a flat surface. This allows uniform and satisfactory scribe lines to be formed over the connected portion during the fabrication of semiconductor laser apparatuses. As a result, flat and satisfactory cleavage planes can be formed, resulting in satisfactory cavity facets.

The first substrate may be an optically transparent substrate. With the first substrate being an optically transparent substrate, the second and the third semiconductor laser devices can be visually seen through the first substrate in bonding the second and third semiconductor laser devices to the one surface side of the first semiconductor laser device. This facilitates the positioning of the second and third semiconductor laser devices. As a result, accurate adjustments can be made to their junction positions. Consequently, the positioning accuracy is improved in the emission points of the first, second, and third semiconductor laser devices.

The first semiconductor layer may be made of a nitride-based semiconductor. With the first semiconductor layer being made of a high thermal conductivity nitride-based semiconductor, heat dissipation from the first semiconductor layer of the first semiconductor laser device is improved. This results in improved temperature characteristics and reliability of the first semiconductor laser device.

The second semiconductor layer may be made of a gallium indium phosphide-based semiconductor. This allows the second semiconductor laser device to emit a light beam having a red wavelength.

The third semiconductor layer may be made of a gallium arsenide-based semiconductor. This allows the second semiconductor laser device to emit a light beam having an infrared wavelength.

According to another aspect of the present invention, there is provided a method of fabricating a semiconductor laser apparatus capable of emitting a plurality of light beams having different wavelengths, comprising the steps of: forming a first semiconductor laser device by forming on a first substrate a first semiconductor layer that emits a light beam having a first wavelength; forming a second semiconductor laser device by forming on a second substrate a second semiconductor layer that emits a light beam having a second wavelength; forming a third semiconductor laser device by forming on the second substrate a third semiconductor layer that emits a light beam having a third wavelength; forming a first electrode on the first substrate or the first semiconductor layer; and bonding the second and third semiconductor laser devices onto the first electrode of the first semiconductor laser device such that at least a portion of the first electrode is exposed, at least one of the first, second, and third wavelengths being different from another wavelength.

According to the fabrication method of the semiconductor laser apparatus, the first semiconductor laser device is fabricated by forming on the first substrate the first semiconductor layer emitting the light beam having the first wavelength. Then, the second semiconductor laser device is fabricated by forming on the second substrate the second semiconductor layer emitting the light beam having the second wavelength. Further, the third semiconductor laser device is fabricated by forming on the second substrate the third semiconductor layer emitting the light beam having the third wavelength.

After this, the first electrode is formed on the first substrate or the first semiconductor layer, and the second and third semiconductor laser devices are bonded onto the first electrode such that the at least a portion of the first electrode of the first semiconductor laser device is exposed.

In the resulting semiconductor laser apparatus, the at least a portion of the first electrode of the first semiconductor laser device is exposed on the surface where the first semiconductor laser device is bonded with the second and third semiconductor laser devices. Consequently, the first electrode of the first semiconductor laser device can be easily wired.

Moreover, the second semiconductor laser device and the third semiconductor laser device are bonded onto the first electrode of the first semiconductor laser device, so that the second and third semiconductor laser devices can be easily wired from the same side as one surface of the first semiconductor laser device.

This results in improved flexibility in wiring the first, second, and third semiconductor laser devices.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4(c) and 4(d) are schematic cross sections showing steps of an example of a method of fabricating the semiconductor laser apparatus according to the first embodiment;

FIG. 10 is a schematic cross section showing an example of a semiconductor laser apparatus according to a second embodiment;

FIG. 11 is a schematic cross section showing a step of an example of a method of fabricating the semiconductor laser apparatus according to the second embodiment;

FIG. 12 is a schematic cross section showing a step of an example of a method of fabricating the semiconductor laser apparatus according to the second embodiment;

FIG. 13 is a schematic cross section showing a step of an example of a method of fabricating the semiconductor laser apparatus according to the second embodiment;

FIG. 14 is a schematic cross section showing a step of an example of a method of fabricating the semiconductor laser apparatus according to the second embodiment;

FIG. 15 is a schematic cross section showing a step of an example of a method of fabricating the semiconductor laser apparatus according to the second embodiment;

FIG. 21 is a schematic cross section of the semiconductor laser apparatus of FIG. 19 and FIG. 20 when assembled on a heat sink;

FIG. 25(a) is a diagram for use in illustrating scribe lines that are formed during the fabrication of semiconductor laser apparatuses according to the seventh embodiment, and FIG. 25(b) is a schematic diagram showing scribe lines that are formed during the fabrication of semiconductor laser apparatuses 1000X, each of which has an n-GaAs substrate 50 separated between the red semiconductor laser device 2 and the infrared semiconductor laser device 3.

DESCRIPTION OF THE PREFERRED EMBODIMENTS

Figure 1:
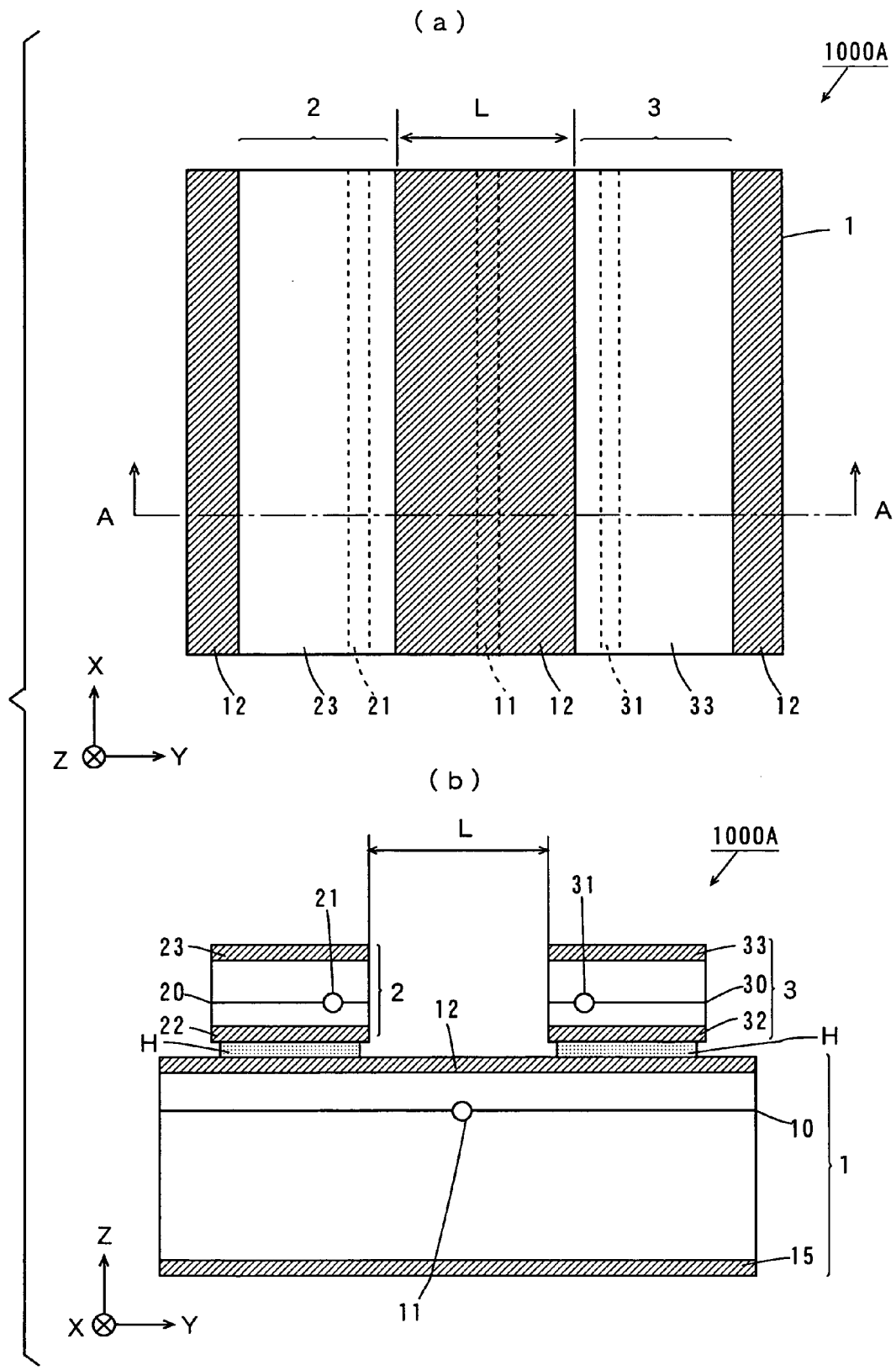
FIGS. 1(a) and 1(b) are schematic top view and schematic cross section, respectively, showing an example of a semiconductor laser apparatus according to a first embodiment.

A semiconductor laser apparatus according to embodiments of the present invention will be described below.

First Embodiment

FIGS. 1(a) and 1(b) are schematic top view and schematic cross section, respectively, that show an example of a semiconductor laser apparatus according to a first embodiment. FIG. 1(a) shows a schematic top view of the semiconductor laser apparatus 1000A, and FIG. 1(b) shows a schematic cross section of the semiconductor laser apparatus 1000A of FIG. 1(a) along the line A-A.

The semiconductor laser apparatus 1000A according to this embodiment comprises a semiconductor laser device 1 that emits a laser beam having a wavelength of approximately 400 nm (hereinafter referred to as a blue-violet semiconductor laser device 1), a semiconductor laser device 2 that emits a laser beam having a wavelength of approximately 650 nm (hereinafter referred to as a red semiconductor laser device 2), and a semiconductor laser device 3 that emits a laser beam having a wavelength of approximately 780 nm (hereinafter referred to as an infrared semiconductor laser device 3).

In this embodiment, the blue-violet semiconductor laser device 1 is fabricated by forming a semiconductor layer on a GaN substrate. The red semiconductor laser device 2 and infrared semiconductor laser device 3 are each fabricated by forming a semiconductor layer on a GaAs substrate. Fabrication of these semiconductor laser devices will be discussed below.

As shown in FIGS. 1(a) and 1(b), the blue-violet semiconductor laser device 1 has a p-electrode 12 on its upper surface and an n-electrode 15 on its lower surface. The blue-violet semiconductor laser device 1 has a p-n junction surface 10 where a p-type semiconductor and an n-type semiconductor are joined.

The red semiconductor laser device 2 has an n-electrode 23 on its upper surface and a p-electrode 22 on its lower surface. The red semiconductor laser device 2 has a p-n junction surface 20 where a p-type semiconductor and an n-type semiconductor are joined.

The infrared semiconductor laser device 3 has an n-electrode 33 on its upper surface and a p-electrode 32 on its lower surface. The infrared semiconductor laser device 3 has a p-n junction surface 30 where a p-type semiconductor and an n-type semiconductor are joined.

Solder films H are partially formed on the upper surface of the p-electrode 12 of the blue-violet semiconductor laser device 1. On the upper surface of the p-electrode 12 of FIG. 1, the two solder films H are formed with a predetermined distance L between them. This results in a portion of the p-electrode 12 exposed.

The p-electrode 22 of the red semiconductor laser device 2 is bonded onto the p-electrode 12 via the solder film H. The p-electrode 32 of the infrared semiconductor laser device 3 is also bonded onto the p-electrode 12 via the solder film H.

In this manner, the p-electrode 22 of the red semiconductor laser device 2 and the p-electrode 12 of the blue-violet semiconductor laser device 1 are electrically connected, while the p-electrode 32 of the infrared semiconductor laser device 3 and the p-electrode 12 of the blue-violet semiconductor laser device 1 are electrically connected. This makes the p-electrode 12 of the blue-violet semiconductor laser device 1, the p-electrode 22 of the red semiconductor laser device 2, and the p-electrode 32 of the infrared semiconductor laser device 3 the common electrodes.

In FIGS. 1(a) and 1(b), three directions orthogonal to one another are defined as X-direction, Y-direction, and Z-direction, as indicated by the arrows X, Y, Z. The X- and Y-directions are in parallel with, and the Z-direction is vertical to the p-n junction surfaces 10, 20, 30 in the blue-violet semiconductor laser device 1, red semiconductor laser device 2, and infrared semiconductor laser device 3.

When a voltage is applied between the p-electrode 12 and the n-electrode 15 of the blue-violet semiconductor laser device 1, a laser beam having a wavelength of approximately 400 nm is emitted in the X-direction from a predetermined region 11 (hereinafter referred to as a blue-violet-beam-emission point 11) in the p-n junction surface 10.

When a voltage is applied between the p-electrode 22 and the n-electrode 23 of the red semiconductor laser device 2, a laser beam having a wavelength of approximately 650 nm is emitted in the X-direction from a predetermined region 21 (hereinafter referred to as a red-beam-emission point 21) in the p-n junction surface 20.

When a voltage is applied between the p-electrode 32 and the n-electrode 33 of the infrared semiconductor laser device 3, a laser beam having a wavelength of approximately 780 nm is emitted in the X-direction from a predetermined region 31 (hereinafter referred to as an infrared-beam-emission point 31) in the p-n junction surface 30.

Figure 2:
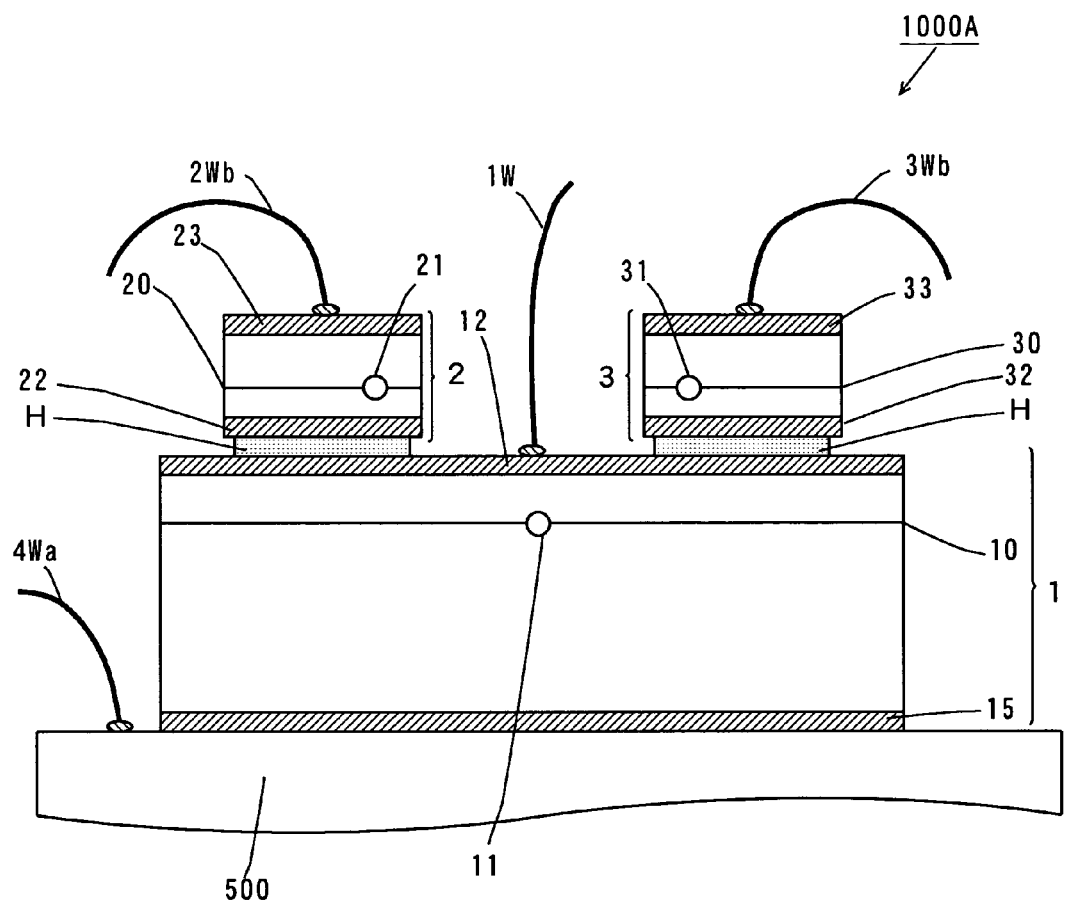
FIG. 2 is a schematic cross section of the semiconductor laser apparatus of FIG. 1 when assembled on a heat sink.
Figure 3:
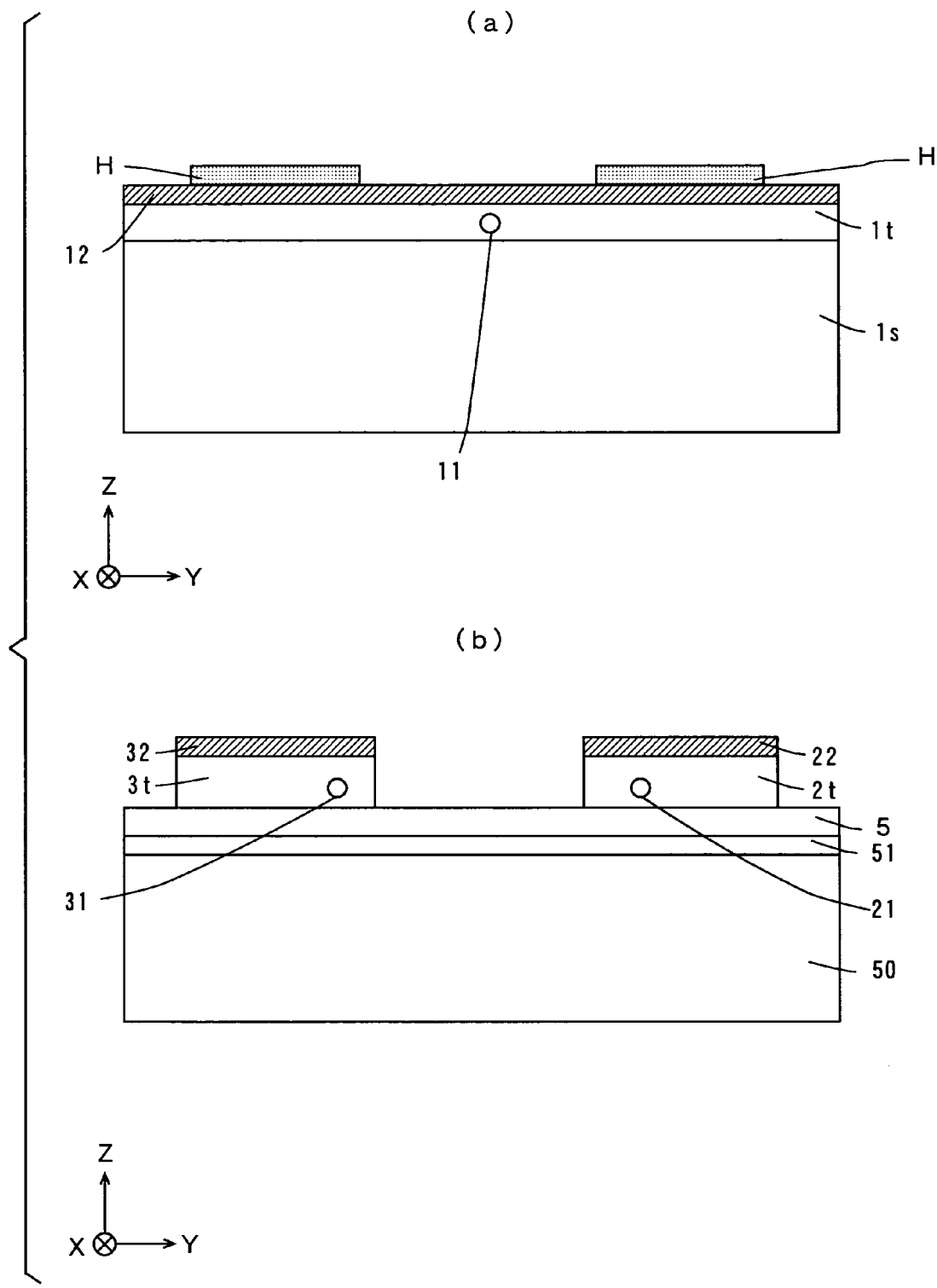
FIGS. 3(a) and 3(b) are schematic cross sections showing steps of an example of a method of fabricating the semiconductor laser apparatus according to the first embodiment.
Figure 5:
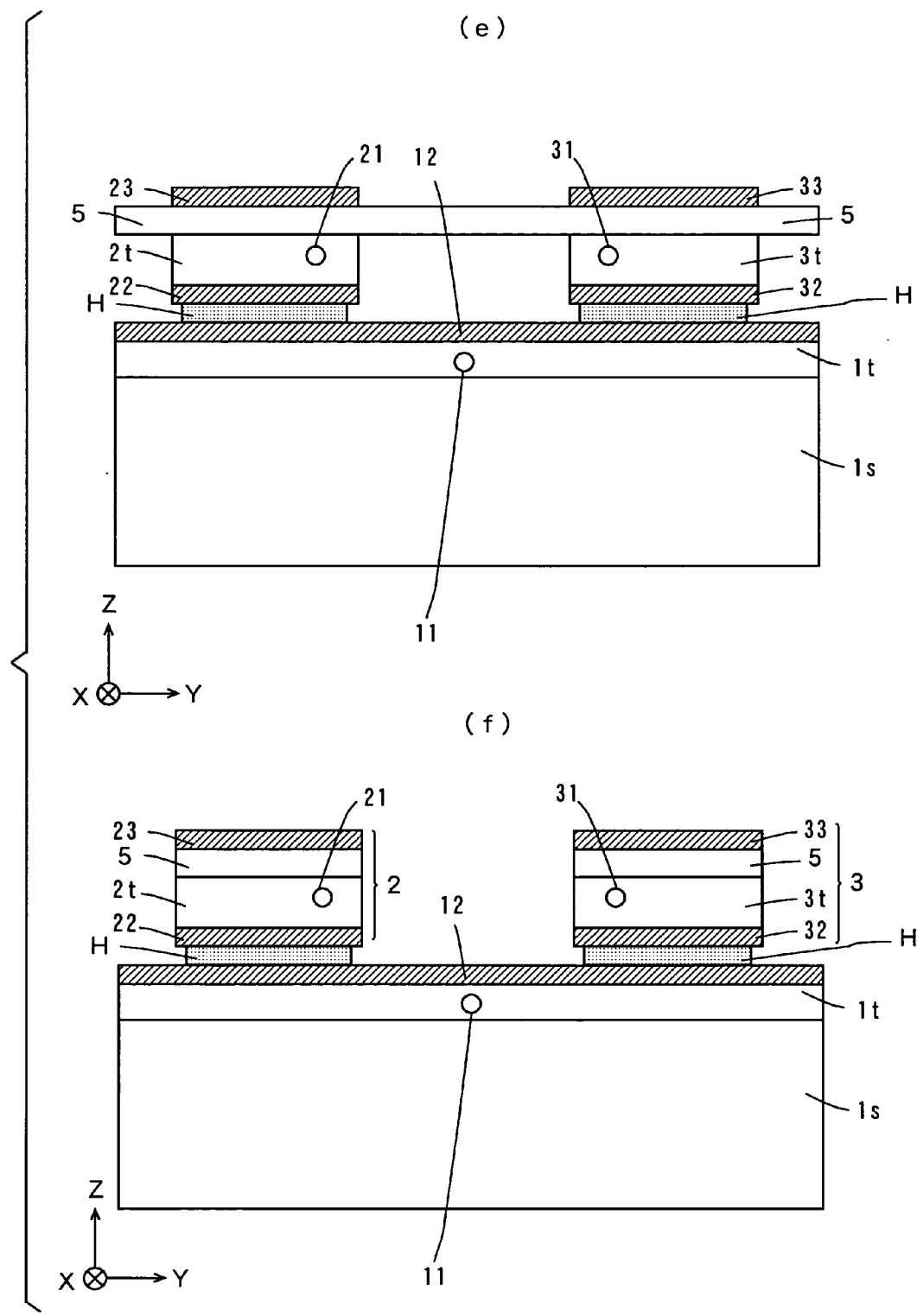
FIGS. 5(e) and 5(f) are schematic cross sections showing steps of an example of a method of fabricating the semiconductor laser apparatus according to the first embodiment.
Figure 6:
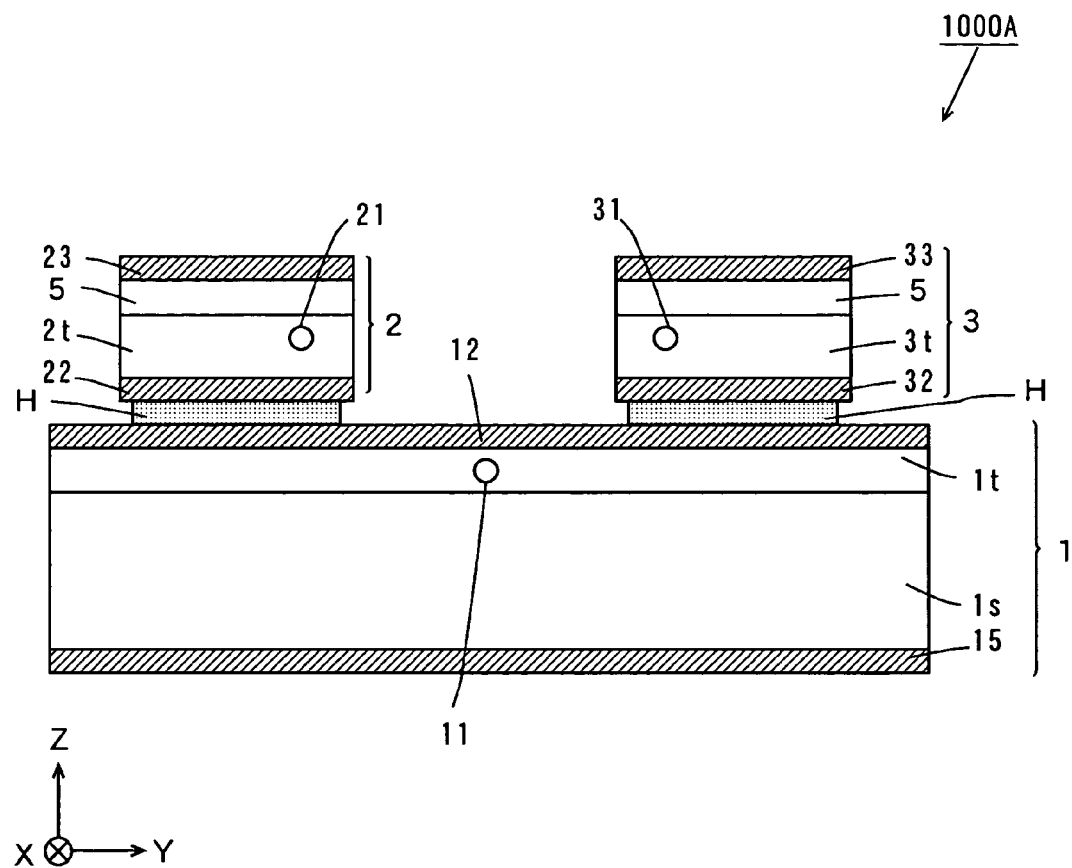
FIG. 6(g) is a schematic cross section showing a step of an example of a method of fabricating the semiconductor laser apparatus according to the first embodiment.

FIG. 2 is a schematic cross-section of the semiconductor laser apparatus 1000A of FIG. 1 when assembled on a heat sink. When the semiconductor laser apparatus 1000A of FIG. 1 is used in an optical pick up apparatus, it is mounted on the heat sink 500 which is made of a metal such as Cu, CuW or Al, as shown in FIG. 2. Then, using wires 1W, 2Wb, 3Wb, 4Wa, the p-electrodes 12, 22, 32 and the n-electrodes 23, 33, 15 are wired.

As described above, the p-electrode 12 of the blue-violet semiconductor laser device 1, p-electrode 22 of the red semiconductor laser device 2, and p-electrode 32 of the infrared semiconductor laser device 3 are electrically connected. This allows the p-electrode 12 of the blue-violet semiconductor laser device 1, p-electrode 22 of the red semiconductor laser device 2, and p-electrode 32 of the infrared semiconductor laser device 3 to be commonly connected, resulting in a common-anode connection.

The p-electrode 12 that is common among the blue-violet semiconductor laser device 1, red semiconductor laser device 2, and infrared semiconductor laser device 3 is connected to a drive circuit not shown herein through the wire 1W.

The n-electrode 23 of the red semiconductor laser device 2 is connected to the drive circuit not shown through the wire 2Wb. The n-electrode 33 of the infrared semiconductor laser device 3 is connected to the drive circuit not shown herein through the wire 3Wb.

The wiring of the n-electrode 15 of the blue-violet semiconductor laser device 1 is accomplished by bonding the n-electrode 15 onto a surface of the heat sink 500. This allows for an electrical connection between the n-electrode 15 and the surface of the heat sink 500. The heat sink 500 is connected to the drive circuit not shown through the wire 4Wa.

The blue-violet semiconductor laser device 1 can be driven by applying a voltage between the wire 1W and wire 4Wa. The red semiconductor laser device 2 can be driven by applying a voltage between the wire 1W and wire 2Wb. The infrared semiconductor laser device 3 can be driven by applying a voltage between the wire 1W and wire 3Wb. In this manner, each of the blue-violet semiconductor laser device 1, red semiconductor laser device 2, and infrared semiconductor laser device 3 can be driven independently.

A method of fabricating semiconductor laser apparatuses 1001A according to this embodiment will be described. FIG. 3(a) through FIG. 6(g) are schematic cross sections showing the steps of an example of a method for making the semiconductor laser apparatuses of the first embodiment. In FIG. 3(a) through FIG. 6(g) also, the X-, Y-, and Z-directions are defined as in FIG. 1.

As shown in FIG. 3(a), in order to fabricate the blue-violet semiconductor laser device 1, a semiconductor layer 1t is formed with a layered structure on one surface of an n-GaN substrate is. Then, a p-electrode 12 is formed before the formation of solder films H made of Au—Sn on predetermined regions (which are two) of the semiconductor layer 1t, in order to bond the red semiconductor laser device 2 and infrared semiconductor laser device 3 onto the blue-violet semiconductor laser device 1.

The solder films H are formed at a distance from each other in the Y-direction across the central portion of the p-electrode 12. At the central portion of the p-electrode 12, a ridge portion having a convex-shaped cross-section that extends in the X-direction is formed, although not shown. A blue-violet-beam-emission point 11 of the blue-violet semiconductor laser device 1 is formed below the ridge portion of the p-electrode 12. Note that the n-electrode 15 of the blue-violet semiconductor laser device 1 will be formed at a subsequent step.

Meanwhile, as shown in FIG. 3(b), in order to fabricate the red semiconductor laser device 2 and infrared semiconductor laser device 3, an etching stop layer 51 made of AlGaAs is formed on one surface of an n-GaAs substrate 50, followed by the formation of an n-GaAs contact layer 5 on the etching stop layer 51.

Then, a semiconductor layer 2t with an AlGaInP-based layered structure and a semiconductor layer 3t with an AlGaAs-based layered structure are formed at a distance from each other on the n-GaAs contact layer 5. After this, a p-electrode 22 is formed on the semiconductor layer 2t, and a p-electrode 32 is formed on the semiconductor layer 3t. Note that the n-electrode 23 and n-electrode 33 of the red semiconductor laser device 2 and the infrared semiconductor laser device 3 will be formed at a subsequent step. Although not shown in FIG. 3(b), a ridge portion having a convex-shaped cross section that extends in the X-direction is formed also in each of the semiconductor layers 2t, 3t.

Next, as shown in FIG. 4(c), the p-electrode 22 formed on the semiconductor layer 2t and the p-electrode 32 formed on the semiconductor layer 3t are bonded, via the solder films H, onto the predetermined regions (i.e., the regions on which the solder films H are formed) of the p-electrode 12 on the semiconductor layer 1t.

At this time, both the n-GaN substrate 1s and the n-GaAs substrate 50 have a thickness of approximately 300 to 500 μm. This makes the n-GaN substrate 1s and n-GaAs substrate 50 easy to handle, thereby facilitating the bonding of the p-electrodes 22, 32 to the p-electrode 12.

The n-GaN substrate is of the blue-violet semiconductor laser device 1 is transparent. This allows the junction positions of the p-electrodes 22, 32 with the p-electrode 12 to be visually seen through the n-GaN substrate is. This facilitates the positioning of the red semiconductor laser device 2 and infrared semiconductor laser device 3 onto the blue-violet semiconductor laser device 1.

Note that in this embodiment, the substrate of the blue-violet semiconductor laser device 1 may include any optically transparent substrates other than the n-GaN substrate 1s. This facilitates the positioning of the red semiconductor laser device 2 and infrared semiconductor laser device 3 onto the blue-violet semiconductor laser device 1, as described above.

As shown in FIG. 4(d), the n-GaAs substrate 50 is thinned to a given thickness by etching, polishing or other processes, and then etched to the etching stop layer 51.

After the removal of the etching stop layer 51 as shown in FIG. 5(e), the n-electrode 23 and n-electrode 33 are formed, respectively, by patterning on the n-GaAs contact layer 5 above the semiconductor layers 2t, 3t.

As shown in FIG. 5(f), a portion of the n-GaAs contact layer 5 where the semiconductor layer 2t and semiconductor layer 3t are not formed is etched away. In this manner, the red semiconductor laser device 2 and the infrared semiconductor laser device 3 are fabricated. Detailed structures of the red semiconductor laser device 2 and infrared semiconductor laser device 3 will be discussed below.

Then, after the n-GaN substrate is has been thinned by polishing as shown in FIG. 6(g), an n-electrode 15 is formed on the lower surface of the n-GaN substrate 1s. In this manner, the blue-violet semiconductor laser device 1 is fabricated. Detailed structure of the blue-violet semiconductor laser device 1 will be discussed below.

Finally, the blue-violet semiconductor laser device 1, red semiconductor laser device 2, and infrared semiconductor laser device 3 thus fabricated are separated into bars in the Y-direction by cleavage, followed by the formation of cavity facets. After protection films have been formed over the cavity facets, the resultant blue-violet semiconductor laser devices 1, red semiconductor laser devices 2, and infrared semiconductor laser devices 3 are cut smaller and smaller in the X-direction into chips. In this manner, semiconductor laser apparatuses 1000A according to the embodiment are completed.

Now refer to FIGS. 7(a) and 7(b), detailed structure of the blue-violet semiconductor laser device 1 along with a fabrication method thereof will be described.

Figure 7:
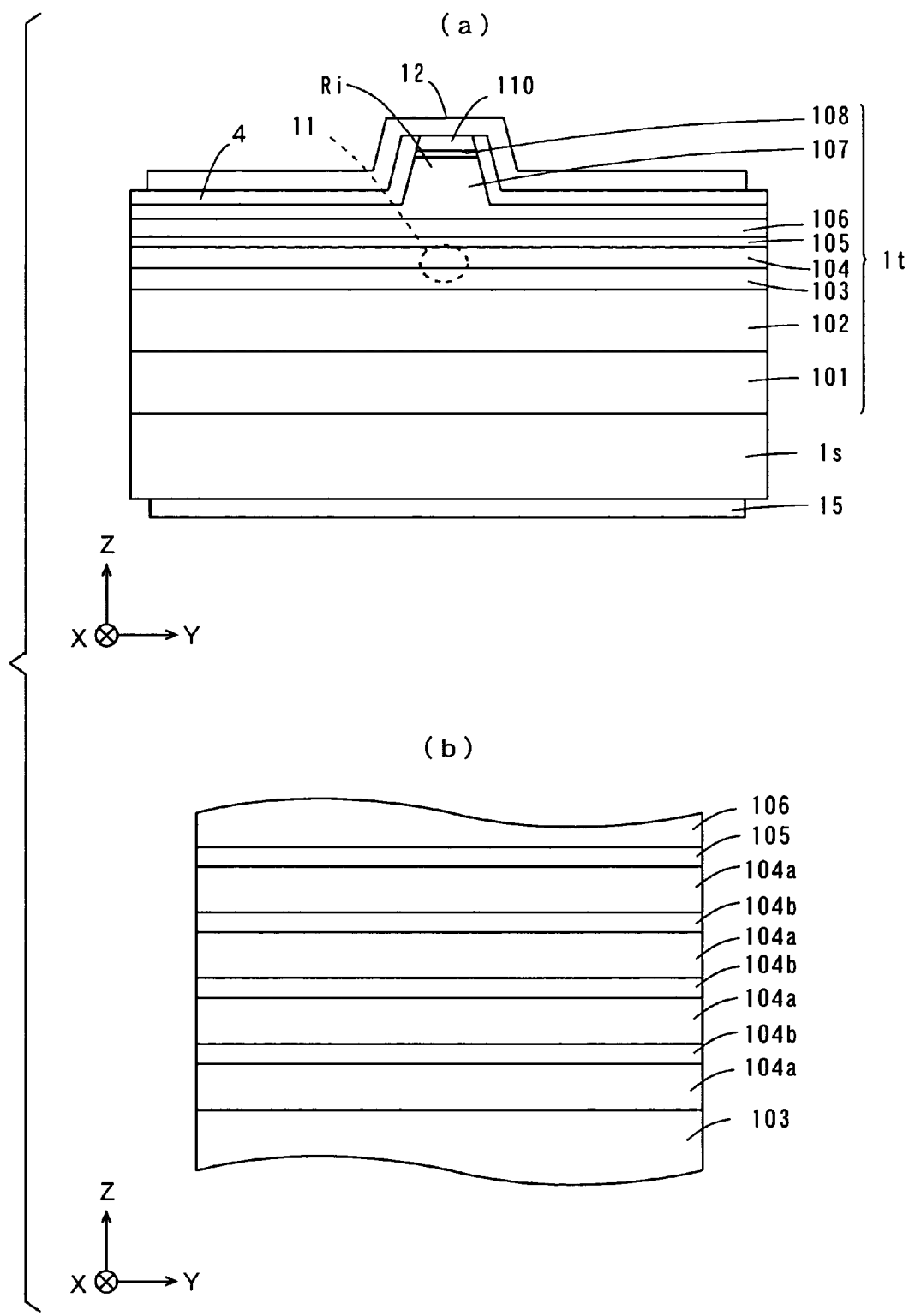
FIGS. 7(a) and 7(b) are schematic cross sections for use in illustrating detailed structure of a blue-violet semiconductor laser device 1.

FIGS. 7(a) and 7(b) are schematic cross sections for use in illustrating the detailed structure of the blue-violet semiconductor laser device 1. In the following also, the X-, Y-, and Z-directions are defined as in FIG. 1.

As described above, the fabrication of the blue-violet semiconductor laser device 1 involves forming the semiconductor layer 1t with a layered structure on the n-GaN substrate 1s.

As shown in FIG. 7(a), as the semiconductor layer 1t with a layered structure, an n-GaN layer 101, n-AlGaN cladding layer 102, n-GaN optical guide layer 103, an MQW (multi-quantum well) active layer 104, undoped AlGaN cap layer 105, undoped GaN optical guide layer 106, p-AlGaN cladding layer 107, and undoped GaInN contact layer 108 are formed in order on the n-GaN substrate 1s. Each of these layers is formed by MOCVD (metal organic chemical vapor deposition), for example.

As shown in FIG. 7(b), the MQW active layer 104 has a structure that is composed of an alternate lamination of four undoped GaInN barrier layers 104a and three undoped GaInN well layers 104b.

For example, the n-AlGaN cladding layer 102 has an Al composition of 0.15 and a Ga composition of 0.85. The n-GaN layer 101, n-AlGaN cladding layer 102, and n-GaN optical guide layer 103 are each doped with Si.

The undoped GaInN barrier layer 104a has a Ga composition of 0.95 and an In composition of 0.05. The undoped GaInN well layer 104b has a Ga composition of 0.90 and an In composition of 0.10. The p-AlGaN cap layer 105 has an Al composition of 0.30 and a Ga composition of 0.70.

The p-AlGaN cladding layer 107 has an Al composition of 0.15 and a Ga composition of 0.85. The p-AlGaN cladding layer 107 is doped with Mg. The undoped GaInN contact layer 108 has a Ga composition of 0.95 and an In composition of 0.05.

A stripe-shaped ridge portion Ri that extends in the X-direction is formed in the p-AlGaN cladding layer 107 of the above-mentioned semiconductor layer 1t. The ridge portion Ri in the p-AlGaN cladding layer 107 has a width of approximately 1.5 μm.

The undoped GaInN contact layer 108 is formed on the upper surface of the ridge portion Ri in the p-AlGaN cladding layer 107.

An insulating film 4 made of $SiO_2$ is formed on the upper surfaces of the p-AlGaN cladding layer 107 and undoped GaInN contact layer 108, and a portion of the insulating film 4 formed on the undoped GaInN contact layer 108 is etched away. Then, a p-electrode 110 made of Pd/Pt/Au is formed on the undoped GaInN contact layer 108 exposed outside. After this, a p-electrode 12 is formed by sputtering, vacuum evaporation or electron beam evaporation, so as to cover the upper surface of the p-electrode 110 and the upper surface of the insulating film 4.

In this manner, the semiconductor layer 1t is formed with a layered structure on the one side of the n-GaN substrate 1s. On the other side of the n-GaN substrate 1s, an n-electrode 15 made of Ti/Pt/Au is formed.

The blue-violet semiconductor laser device 1 has a blue-violet-beam-emission point 11 formed at a position in the MQW active layer 104 below the ridge portion Ri. In this embodiment, the MQW active layer 104 corresponds to the p-n junction surface 10 of FIG. 1.

Figure 8:
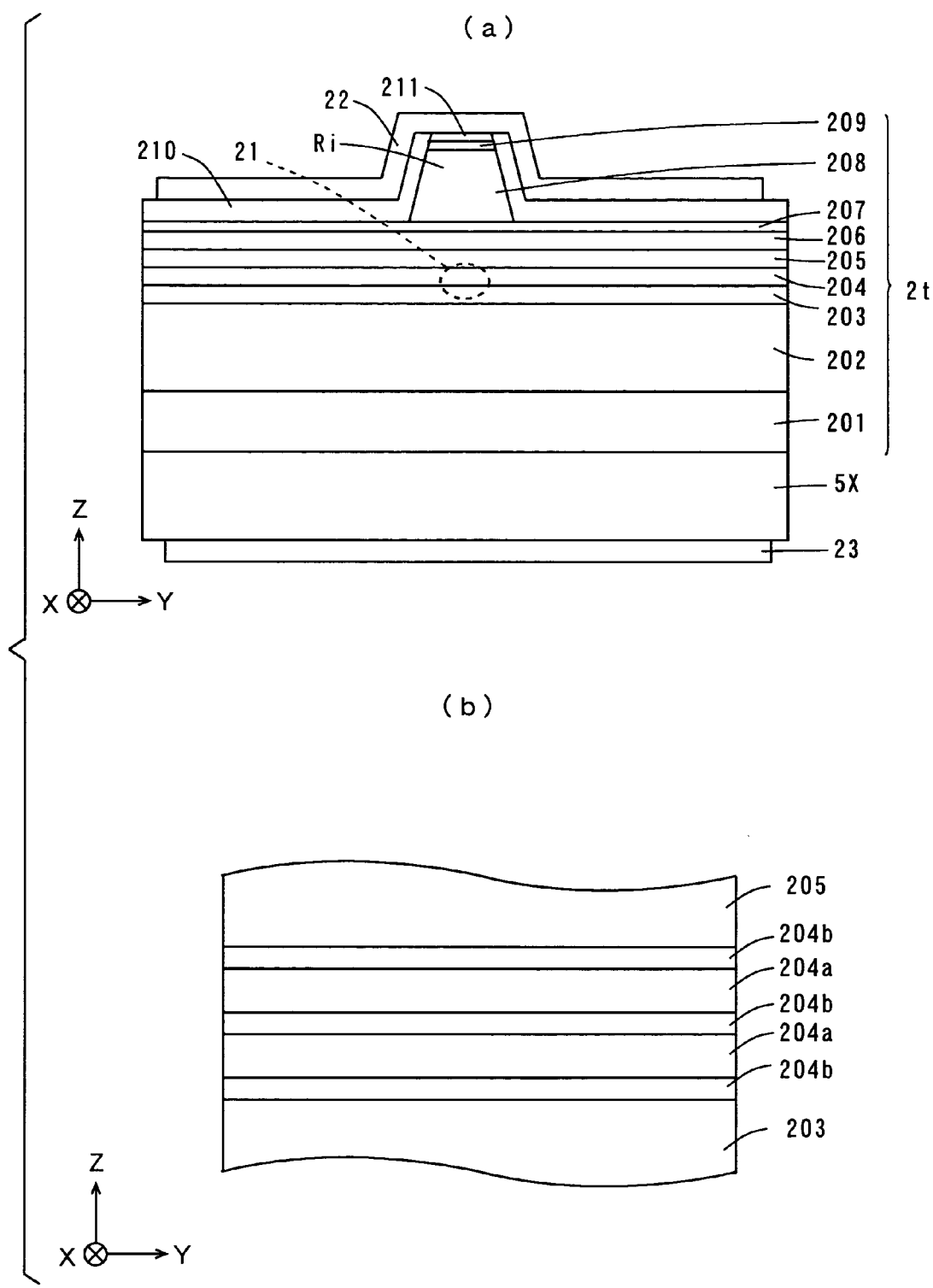
FIGS. 8(a) and 8(b) are schematic cross sections for use in illustrating detailed structure of a red semiconductor laser device 2.

Now refer to FIGS. 8(a) and 8(b), detailed structure of the red semiconductor laser device 2 along with a fabrication method thereof will be described.

FIGS. 8(a) and 8(b) are schematic cross sections for use in illustrating the detailed structure of the red semiconductor laser device 2. In the following also, the X-, Y-, and Z-directions are defined as in FIG. 1. In this embodiment, the red semiconductor laser device 2 is fabricated by forming the semiconductor layer 2t on then-GaAs contact layer 5; however, in the following description, the semiconductor layer 2t is formed on an n-GaAs substrate 5X instead of the n-GaAs contact layer 5. The n-GaAs substrate 5X is doped with Si.

As shown in FIG. 8(a), as the semiconductor layer 2t with a layered structure, an n-GaAs layer 201, n-AlGaInP cladding layer 202, undoped AlGaInP optical guide layer 203, MQW (multiple quantum well) active layer 204, undoped AlGaInP optical guide layer 205, p-AlGaInP first cladding layer 206, p-InGaP etching stop layer 207, p-AlGaInP second cladding layer 208, and p-contact layer 209 are formed in order on the n-GaAs substrate 5X. Each of these layers is formed by MOCVD (metal organic chemical vapor deposition), for example.

As shown in FIG. 8(b), the MQW active layer 204 has a structure that is composed of an alternate lamination of two undoped AlGaInP barrier layers 204a and three undoped InGaP well layers 204b.

For example, the n-AlGaInP cladding layer 202 has an Al composition of 0.70, a Ga composition of 0.30, an In composition of 0.50, and a P composition of 0.50. The n-GaAs layer 201 and n-AlGaInP cladding layer 202 are each doped with Si.

The undoped AlGaInP optical guide layer 203 has an Al composition of 0.50, a Ga composition of 0.50, an In composition of 0.50, and a P composition of 0.50.

The undoped AlGaInP barrier layer 204a has an Al composition of 0.50, a Ga composition of 0.50, an In composition of 0.50, and a P composition of 0.50. The undoped InGaP well layer 204b has an In composition of 0.50 and a Ga composition of 0.50. The undoped AlGaInP optical guide layer 205 has an Al composition of 0.50, a Ga composition of 0.50, an In composition of 0.50, and a P composition of 0.50.

The p-AlGaInP first cladding layer 206 has an Al composition of 0.70, a Ga composition of 0.30, an In composition of 0.50, and a P composition of 0.50. The p-InGaP etching stop layer 207 has an In composition of 0.50 and a Ga composition of 0.50.

The p-AlGaInP second cladding layer 208 has an Al composition of 0.70, a Ga composition of 0.30, an In composition of 0.50, and a P composition of 0.50.

The p-contact layer 209 has a layered structure that includes a p-GaInP layer and a p-GaAs layer. The p-GaInP has a Ga composition of 0.5 and an In composition of 0.5.

Note that the compositions of the above-mentioned AlGaInP-based materials are represented by a general formula $(Al_aGa_b)_{0.5}In_cP_d$, wherein a is the Al composition; b is the Ga composition; c is the In composition; and d is the P composition.

The p-GaInP and p-GaAs of the p-AlGaInP first cladding layer 206, p-InGaP etching stop layer 207, p-AlGaInP second cladding layer 208, and p-contact layer 209 are doped with Zn.

In the above-described example, the p-AlGaInP second cladding layer 208 is formed only on a portion (central portion) of the p-InGaP etching stop layer 207. Then, the p-contact layer 209 is formed on the upper surface of the p-AlGaInP second cladding layer 208.

In this manner, the p-AlGaInP second cladding layer 208 and p-contact layer 209 of the above-mentioned semiconductor layer 2t form a stripe-shaped ridge portion Ri that extends in the X-direction. The ridge portion formed by the p-AlGaInP second cladding layer 208 and p-contact layer 209 has a width of approximately 2.5 μm.

An insulating film 210 made of $SiO_2$ is formed on the upper surface of the p-InGaP etching stop layer 207, on the sides of the p-AlGaInP second cladding layer 208, and on the upper surface and sides of the p-contact layer 209, after which a portion of the insulating film 210 formed on the p-contact layer 209 is etched away. Then, a p-electrode 211 made of Cr/Au is formed on the p-contact layer 209 exposed outside. After this, a p-electrode 22 is formed by sputtering, vacuum evaporation or electron beam evaporation, so as to cover the upper surface of the p-electrode 211 and the upper surface of the insulating film 210.

In this manner, the semiconductor layer 2t is formed with a layered structure on the one surface of the n-GaAs substrate 5X. On the other side of the n-GaAs substrate 5X, an n-electrode 23 made of AuGe/Ni/Au is formed.

The red semiconductor laser device 2 has a red-beam-emission point 21 formed at a position in the MQW active layer 204 below the ridge portion Ri. In this embodiment, the MQW active layer 204 corresponds to the p-n junction surface 20 of FIG. 1.

Figure 9:
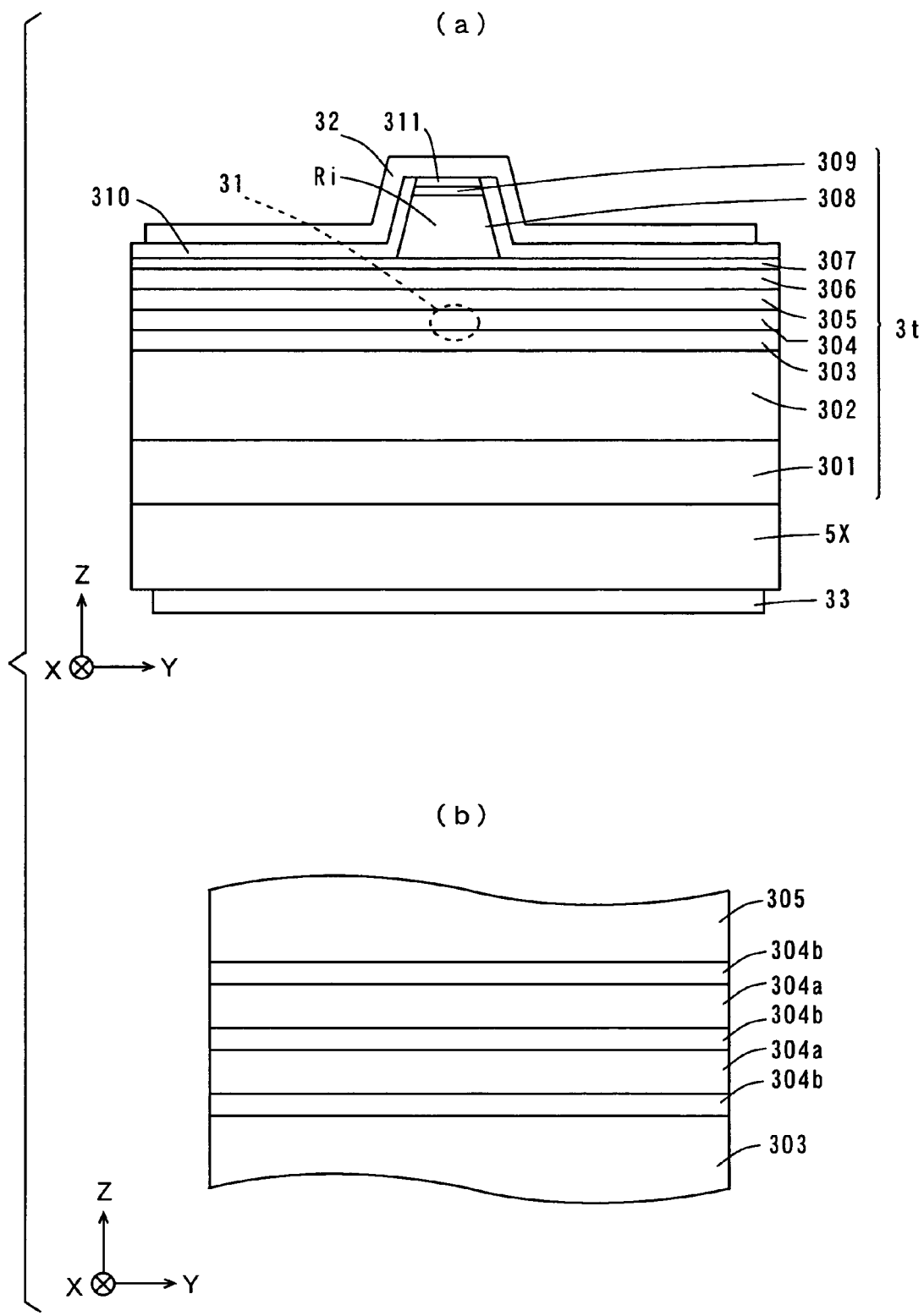
FIGS. 9(a) and 9(b) are schematic cross sections for use in illustrating detailed structure of an infrared semiconductor laser device 3.

Now refer to FIGS. 9(a) and 9(b), detailed structure of the infrared semiconductor laser device 3 along with a fabrication method thereof will be described.

FIGS. 9(a) and 9(b) are schematic cross sections for use in illustrating the detailed structure of the infrared semiconductor laser device 3. In the following also, the X-, Y-, and Z-directions are defined as in FIG. 1. In this embodiment, the infrared semiconductor laser device 3 is fabricated by forming the semiconductor layer 3t on the n-GaAs contact layer 5; however, in the following description, the semiconductor layer 3t is formed on the n-GaAs substrate 5X instead of the n-GaAs contact layer 5. The n-GaAs substrate 5X is doped with Si.

As shown in FIG. 9(a), as the semiconductor layer 3t with a layered structure, an n-GaAs layer 301, n-AlGaAs cladding layer 302, undoped AlGaAs optical guide layer 303, MQW active layer 304, undoped AlGaAs optical guide layer 305, p-AlGaAs first cladding layer 306, p-AlGaAs etching stop layer 307, p-AlGaAs second cladding layer 308, and p-GaAs contact layer 309 are formed in order on the n-GaAs substrate 5X. Each of these layers is formed by MOCVD, for example.

As shown in FIG. 9(b), the MQW active layer 304 has a structure that is composed of an alternate lamination of two undoped AlGaAs barrier layers 304a and three undoped AlGaAs well layers 304b.

For example, the n-AlGaAs cladding layer 302 has an Al composition of 0.45 and a Ga composition of 0.55. The n-GaAs layer 301 and n-AlGaAs cladding layer 302 are each doped with Si.

The undoped AlGaAs optical guide layer 303 has an Al composition of 0.35 and a Ga composition of 0.65. The undoped AlGaAs barrier layer 304a has an Al composition of 0.35 and a Ga composition of 0.65. The undoped AlGaAs well layer 304b has an Al composition of 0.10 and a Ga composition of 0.90. The undoped AlGaAs optical guide layer 305 has an Al composition of 0.35 and a Ga composition of 0.65.

The p-AlGaAs first cladding layer 306 has an Al composition of 0.45 and a Ga composition of 0.55. The p-AlGaAs etching stop layer 307 has an Al composition of 0.70 and a Ga composition of 0.30.

The p-AlGaAs second cladding layer 308 has an Al composition of 0.45 and a Ga composition of 0.55.

The p-AlGaAs first cladding layer 306, p-AlGaAs etching stop layer 307, p-AlGaAs second cladding layer 308, and p-GaAs contact layer 309 are each doped with Zn.

In the above example, the p-AlGaAs second cladding layer 308 is formed on only a portion (central portion) of the p-AlGaAs etching stop layer 307. Then, the p-GaAs contact layer 309 is formed on the upper surface of the p-AlGaAs second cladding layer 308.

In this manner, the p-AlGaAs second cladding layer 308 and p-GaAs contact layer 309 of the above-mentioned semiconductor layer 3t form a stripe-shaped ridge portion Ri that extends in the X-direction. The ridge portion Ri formed by the p-AlGaAs second cladding layer 308 and the p-GaAs contact layer 309 has a width of approximately 2.8 μm.

An insulating film 310 made of SiN is formed on the upper surface of the p-AlGaAs etching stop layer 307, on the sides of the p-AlGaAs second cladding layer 308, and on the upper surface and sides of the p-GaAs contact layer 309, after which a portion of the insulating film 310 formed on the p-GaAs contact layer 309 is etched away. Then, a p-electrode 311 made of Cr/Au is formed on the p-GaAs contact layer 309 exposed outside. Following this, a p-electrode 32 is formed by sputtering, vacuum evaporation or electron beam evaporation, so as to cover the upper surface of the p-electrode 311 and the upper surface of the insulating film 310.

In this manner, the semiconductor layer 3t is formed with a layered structure on the one surface of the n-GaAs substrate 5X. On the other side of the n-GaAs substrate 5X, an n-electrode 33 made of AuGe/Ni/Au is formed.

The infrared semiconductor laser device 3 has an infrared-beam-emission point 31 formed at a position in the MQW active layer 304 below the ridge portion Ri. In this embodiment, the MQW active layer 304 corresponds to the p-n junction surface 30 of FIG. 1.

In the semiconductor laser apparatus 1001A according to the embodiment described above, at least a portion of the p-electrode 12 of the blue-violet semiconductor laser device 1 is exposed between the red semiconductor laser device 2 and the infrared semiconductor laser device 3. This facilitates wiring of the p-electrode 12 of the blue-violet semiconductor laser device 1.

Moreover, since the red semiconductor laser device 2 and the infrared semiconductor laser device 3 are bonded onto the p-electrode 12 of the blue-violet semiconductor laser device 1, the blue-violet semiconductor laser device 1, red semiconductor laser device 2, and infrared semiconductor laser device 3 can be easily wired from the same side as one surface of the semiconductor laser apparatus 1000A.

This results in improved flexibility in wiring the blue-violet semiconductor laser device 1, red semiconductor laser device 2, and infrared semiconductor laser device 3.

In the semiconductor laser apparatus 1000A according to the embodiment, the n-electrode 23 of the red semiconductor laser device 2 is positioned on the surface opposite to the junction with the blue-violet semiconductor laser device 1, and the n-electrode 33 of the infrared semiconductor laser device 3 is positioned on the surface opposite to the junction with the blue-violet semiconductor laser device 1. This allows the p-electrode 12 of the blue-violet semiconductor laser device 1, n-electrode 23 of the red semiconductor laser device 2, and n-electrode 33 of the infrared semiconductor laser device 3 to be wired from the direction of one surface of the semiconductor laser apparatus 1000A, which facilitates the fabrication of the semiconductor laser apparatus 1000A.

In addition, the p-electrode 12 of the blue-violet semiconductor laser device 1 is formed on the semiconductor layer 1t, the n-electrode 23 of the red semiconductor laser device 2 is formed on the n-GaAs contact layer 5, and the n-electrode 33 of the infrared semiconductor laser device 3 is formed on the n-GaAs contact layer 5. The surface of the red semiconductor laser device 2 on the semiconductor layer 2t side and the surface of the infrared semiconductor laser device 3 on the semiconductor layer 3t side are bonded onto the p-electrode 12 of the blue-violet semiconductor laser device 1.

In this manner, the surface of the blue-violet semiconductor laser device 1 on the semiconductor layer 1t side is bonded with the surface of the red semiconductor laser device 2 on the semiconductor layer 2t side and the surface of the infrared semiconductor laser device 3 on the semiconductor layer 3t side.

This brings closer the semiconductor layers 1t, 2t, 3t of the blue-violet semiconductor laser device 1, red semiconductor laser device 2, and infrared semiconductor laser device 3, resulting in a reduced distance among the emission points of the blue-violet semiconductor laser device 1, red semiconductor laser device 2, and infrared semiconductor laser device 3.

Consequently, the blue-violet-beam-emission point 11 of the blue-violet semiconductor laser device 1, red-beam-emission point 21 of the red semiconductor laser device 2, and infrared-beam-emission point 31 of the infrared semiconductor laser device 3 can all approach the center of the semiconductor laser apparatus 1000A. As a result, the blue-violet semiconductor laser device 1, red semiconductor laser device 2, and infrared semiconductor laser device 3 are improved in light extraction efficiency when converging the laser beams through a lens or the like.

Further, in the above-described semiconductor laser apparatus 1001A, the wiring of the blue-violet semiconductor laser device 1, red semiconductor laser device 2, and infrared semiconductor laser device 3 can be reduced by the electrical connection of the p-electrode 22 of the red semiconductor laser device 2 and the p-electrode 32 of the infrared semiconductor laser device 3 with the p-electrode 12 of the blue-violet semiconductor laser device 1. This simplifies the wiring of the semiconductor laser apparatus 1000A while requiring less time and effort.

In the semiconductor laser apparatus 100A according to the embodiment, the n-GaN substrate is of the blue-violet semiconductor laser device 1 is an optically transparent substrate. This enables the red semiconductor laser device 2 and infrared semiconductor laser device 3 to be visually seen through the n-GaN substrate 1s in bonding them to the one surface of the blue-violet semiconductor laser device 1.

This facilitates the positioning of the red semiconductor laser device 2 and infrared semiconductor laser device 3. Therefore, accurate adjustments can be made to their junction positions. As a result, the positioning accuracy can be improved in the blue-violet-beam-emission point 11 of the blue-violet semiconductor laser device 1, red-beam-emission point 21 of the red semiconductor laser device 2, and infrared-beam-emission point 31 of the infrared semiconductor laser device 3.

Moreover, the n-GaN substrate is made of a nitride-based semiconductor is used in the blue-violet semiconductor laser device 1. The use of such n-GaN substrate is made of a high thermal conductivity nitride-based semiconductor improves heat dissipation from the semiconductor layer it of the blue-violet semiconductor laser device 1. This results in improved temperature characteristics and reliability of the blue-violet semiconductor laser device 1.

In this embodiment, the semiconductor laser apparatus 1000A is fabricated by integrating the blue-violet semiconductor laser device 1, red semiconductor laser device 2, and infrared semiconductor laser device 3. However, the plurality of semiconductor laser devices integrated may be any semiconductor laser devices other than those described above, which emit light beams having different wavelengths.

In this embodiment, the semiconductor laser apparatus 1000A is mounted on the heat sink 500, as shown in FIG. 2. The material of the heat sink 500 on which the semiconductor laser apparatus 1000A is mounted may include insulative materials such as AlN, SiC, Si or diamond, or conductive materials such as Cu, CuW or Al.

A package for the semiconductor laser apparatus 1000A may be of any type that can house the semiconductor laser apparatus 1000A, which includes a can package made of metal or a frame package made of resins, for example.

Second Embodiment

FIG. 10 is a schematic cross section showing an example of a semiconductor laser apparatus according to a second embodiment. In the following also, the X-, Y-, and Z-directions are defined as in FIG. 1.

The semiconductor laser apparatus 1000B according to the second embodiment differs in structure from the semiconductor laser apparatus 1000A according to the first embodiment as follows.

As shown in FIG. 10, in this embodiment the red semiconductor laser device 2 and infrared semiconductor laser device 3 are bonded in alignement on one side (in the Y-direction) of the blue-violet-beam-emission point 11 formed in the blue-violet semiconductor laser device 1. This results in one end of the p-electrode 12 of the blue-violet semiconductor laser device 1 being exposed. The red semiconductor laser device 2 has a red-beam-emission point 21, and the infrared semiconductor laser device 3 has an infrared-beam-emission point 31, as described above.

In this manner, the region of the p-electrode 12 of the blue-violet semiconductor laser device 1 outside the red semiconductor laser device 2 and the infrared semiconductor laser device 3 is left exposed, so that wires can be connected to the exposed portion of the p-electrode 12.

This increases flexibility in wiring the p-electrodes of the blue-violet semiconductor laser device 1, red semiconductor laser device 2, and infrared semiconductor laser device 3. In addition, a monolithic red/infrared semiconductor laser device comprising the integrally formed red semiconductor laser device 2 and infrared semiconductor laser device 3 can be bonded onto the blue-violet semiconductor laser device 1.

In the semiconductor laser apparatus 1000B according to this embodiment, the red semiconductor laser device 2 is centrally arranged. This provides for the arrangement of the blue-violet-beam-emission point 11, red-beam-emission point 21, and infrared-beam-emission point 31 in this order in the Y-direction.

Note that the positions of the red-beam-emission point 21 and the infrared-beam-emission point 31 can be changed by changing the arrangement of the red semiconductor laser device 2 and infrared semiconductor laser device 3 on the blue-violet semiconductor laser device 1.

Now, a method of fabricating semiconductor laser apparatuses 1000B according to the second embodiment will be described.

FIG. 11 through FIG. 15 are schematic cross sections showing the steps of an example of a method of making the semiconductor laser apparatuses according to the second embodiment. In FIG. 11 through FIG. 15 also, the X-, Y-, and Z-directions are defined as in FIG. 1.

As described previously in the first embodiment, in order to fabricate the blue-violet semiconductor laser device 1, a semiconductor layer 1t with a layered structure and a p-electrode 12 are formed first in this order on one surface of an n-GaN substrate (n-GaN wafer) 1s. Then, solder films H are formed on predetermined regions of the p-electrode 12. FIG.

11 shows an example of the n-GaN substrate is on which the semiconductor layer 1t, p-electrode 12, and solder films H are formed.

In FIG. 11, the semiconductor layer 1t has two blue-violet-beam-emission points 11. The solder films H are formed at a distance from each other on the sides of each of the blue-violet-beam-emission points 11 in the Y-direction. Ridge portions are formed above the two blue-violet-beam-emission points 11, respectively, although not shown in the figure. The n-electrode 15 of the blue-violet semiconductor laser device 1 will be formed at a subsequent step.

Note that FIG. 11 shows an extracted portion of the n-GaN substrate (n-GaN wafer) 1s. Accordingly, a plurality of additional blue-violet-beam-emission points 11 are formed in fact in the semiconductor layer 1t on the n-GaN substrate (n-GaN wafer) 1s.

Meanwhile, as shown in FIG. 12, in order to fabricate the red semiconductor laser device 2 and the infrared semiconductor laser device 3, an n-GaAs substrate (n-GaAs wafer) 50 is prepared as a common substrate for the two devices. On one surface of the n-GaAs substrate 50, an etching stop layer 51 and an n-GaAs contact layer 5 are formed in order.

Then, semiconductor layers 2t each with an AlGaInP-based layered structure and semiconductor layers 3t each with an AlGaAs-based layered structure are formed on the n-GaAs contact layer 5 at a distance from one another. After this, p-electrodes 22 are formed on the respective semiconductor layers 2t, and p-electrodes 32 are formed on the respective semiconductor layers 3t.

In FIG. 12, two of the semiconductor layers 2t and two of the semiconductor layers 3t are formed on the n-GaAs contact layer 5. Each of the semiconductor layers 2t and the semiconductor layers 3t have a red-beam-emission point 21 and an infrared-beam-emission point 31, respectively.

Note that FIG. 12 shows extracted portions of the n-GaAs substrate (n-GaAs wafer) 50, etching stop layer 51, and n-GaAs contact layer 5. Accordingly, a plurality of additional semiconductor layers 2t and semiconductor layers 3t are formed in fact on the n-GaAs contact layer 5. Each of the semiconductor layers 2t and the semiconductor layers 3t have an additional red-beam-emission point 21 and an infrared-beam-emission point 31, respectively.

Ridge portions are formed above the respective red-beam-emission points 21 and infrared-beam-emission points 31 of the semiconductor layers 2t, 3t, although not shown herein. The n-electrodes 23 and n-electrodes 33 of the red semiconductor laser device 2 and infrared semiconductor laser device 3 will be formed at a subsequent step.

Next, as shown in FIG. 13, the n-GaN substrate 1s and n-GaAs substrate 50 are laminated. The lamination is accomplished by bonding the solder films H formed on the n-GaN substrate 1s with the p-electrodes 22, 32 formed on the n-GaAs substrate 50.

As shown in FIG. 14, the n-GaAs substrate 50 is subsequently thinned to a given thickness by etching, polishing or other processes, and etched to the etching stop layer 51. Then the etching stop layer 51 is removed before the formation of the n-electrodes 23 and n-electrodes 33 by patterning on the predetermined regions of the n-GaAs contact layer 5.

More specifically, the n-electrodes 23 are formed on regions of the n-GaAs contact layer 5 where the semiconductor layers 2t are formed, while the n-electrodes 33 are formed on regions where the semiconductor layers 3t are formed.

Then, portions of the n-GaAs contact layer 5 where the semiconductor layers 2t and semiconductor layers 3t are not formed are etched away, as shown in FIG. 15. In this manner, the red semiconductor laser device 2 and the infrared semiconductor laser device 3 are fabricated.

Meanwhile, the n-GaN substrate 1s is thinned by polishing, and then an n-electrode 15 is formed on the lower surface of the n-GaN substrate 1s. In this manner, the blue-violet semiconductor laser device 1 is fabricated.

Finally, the blue-violet semiconductor laser device 1 thus fabricated is separated by cleavage along the Y-direction into bars. This results in the formation of cavity facets. After this, protection films are formed over the cavity facets, and the resultant blue-violet semiconductor laser devices 1 are subsequently cut smaller and smaller in the X-direction into chips, based on the broken lines CT1 in FIG. 15. In this manner, semiconductor laser apparatuses 1000B according to this embodiment is completed.

The cut positions of the blue-violet semiconductor laser device 1 (as indicated by the broken lines CT1 in FIG. 15) along the X-direction may be changed in the above-described method of fabrication. The blue-violet semiconductor laser device 1 may be cut based on the broken lines CT2 in FIG. 15, for example. In this case, the arrangement of the red semiconductor laser device 2 and infrared semiconductor laser device 3 on the blue-violet semiconductor laser device 1 can be easily changed.

Third Embodiment

Figure 16:
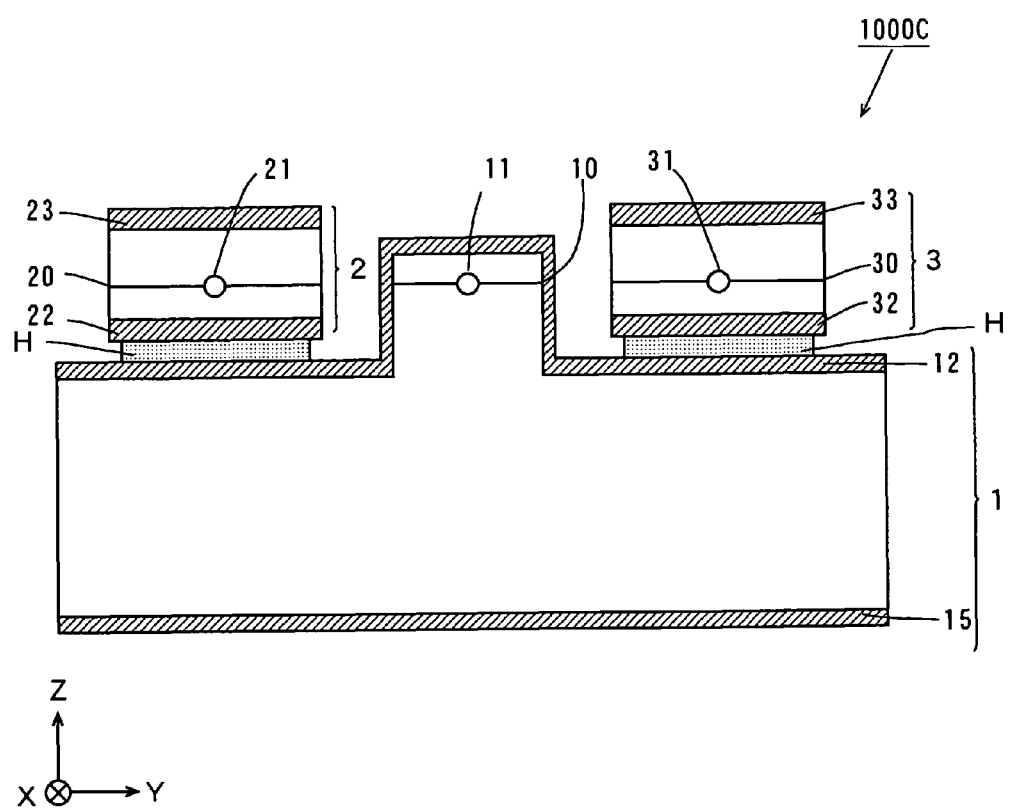
FIG. 16 is a schematic cross section showing an example of a semiconductor laser apparatus according to a third embodiment.

FIG. 16 is a schematic cross section showing an example of a semiconductor laser apparatus according to a third embodiment. In the following also, the X-, Y-, and Z-directions are defined as in FIG. 1.

The semiconductor laser apparatus 1000C according to the third embodiment differs in structure from the semiconductor laser apparatus 1000A according to the first embodiment as follows.

As shown in FIG. 16, the blue-violet semiconductor laser device 1 in this embodiment has a difference in level on the central portion of its upper surface, which is formed as a projection. The projection of the blue-violet semiconductor laser device 1 has a p-n junction surface 10 and a blue-violet-beam-emission point 11. Solder films H are formed on predetermined regions of a p-electrode 12 that extends on the sides of the projection of the blue-violet semiconductor laser device 1. The red semiconductor laser device 2 and infrared semiconductor laser device 3 are bonded onto the blue-violet semiconductor laser device 1 via the solder films.

With this structure, each of the blue-violet-beam-emission point 11, red-beam-emission point 21, and infrared-beam-emission point 31 is positioned on an almost straight line, which facilitates the designs of the semiconductor laser apparatus 1000C and an optical pick up apparatus therefor.

Fourth Embodiment

Figure 17:
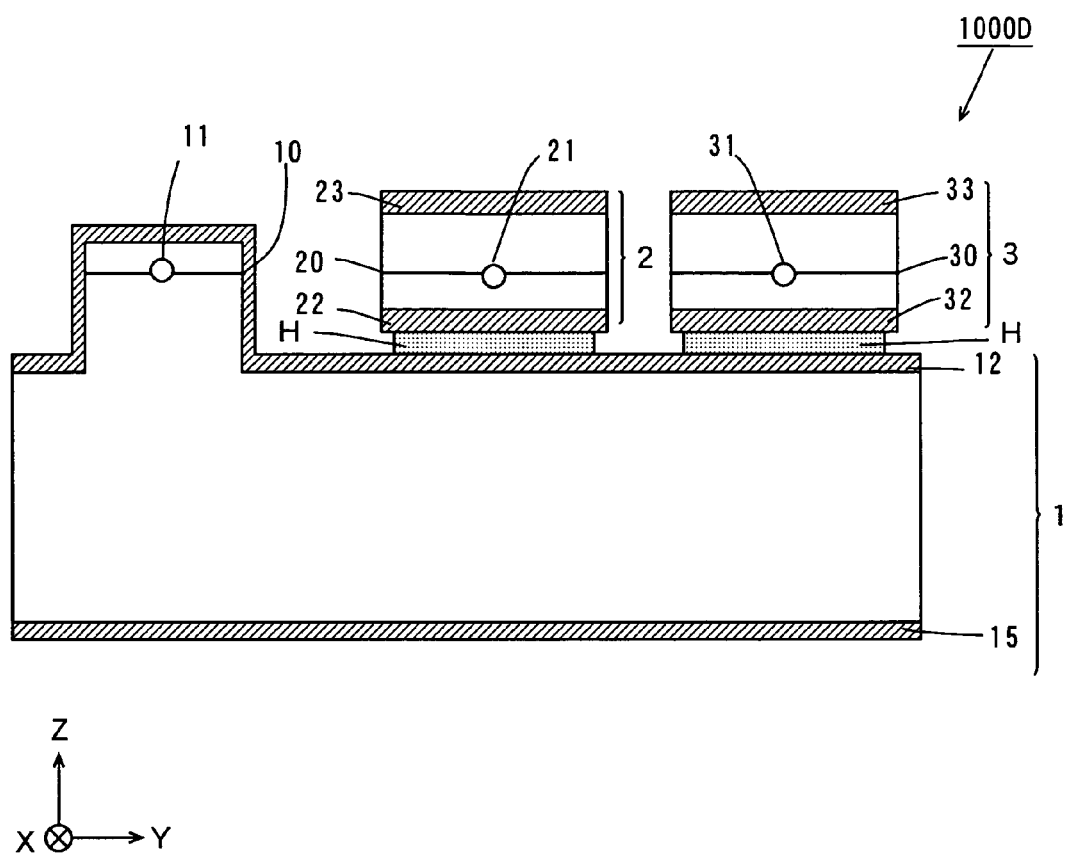
FIG. 17 is a schematic cross section showing an example of a semiconductor laser apparatus according to a fourth embodiment.

FIG. 17 is a schematic cross section showing an example of a semiconductor laser apparatus according to a fourth embodiment. In the following also, the X-, Y-, and Z-directions are defined as in FIG. 1.

The semiconductor laser apparatus 1000D according to the fourth embodiment differs in structure from the semiconductor laser apparatus 1000A according to the first embodiment.

As shown in FIG. 17, the blue-violet semiconductor laser device 1 in this embodiment has a difference in level on one end portion of its upper surface, which is formed as a projection. The projection of the blue-violet semiconductor laser device 1 has a p-n junction surface 10 and a blue-violet-beam-emission point 11. Solder films H are formed on predetermined regions of a p-electrode 12 that extends on one side of the projection (in the Y-direction) of the blue-violet semiconductor laser device 1. The red semiconductor laser device 2 and infrared semiconductor laser device 3 are bonded onto the blue-violet semiconductor laser device 1 via the solder films.

With this structure, each of the blue-violet-beam-emission point 11, red-beam-emission point 21, and infrared-beam-emission point 31 is positioned on an almost straight line, which facilitates the designs of the semiconductor laser apparatus 1000D and an optical pick up apparatus therefor.

Note that in the semiconductor laser apparatus 1000D according to this embodiment, the red semiconductor laser device 2 and infrared semiconductor laser device 3 are bonded in alignment on the one side of the projection (in the Y-direction) of the blue-violet semiconductor laser device 1. The red semiconductor laser device 2 has the red-beam-emission-point 21 while the infrared semiconductor laser device 3 has the infrared-beam-emission point 31.

This allows the red semiconductor laser device 2 to be centrally arranged in the semiconductor laser apparatus 1000D according to this embodiment. This provides for the arrangement of the blue-violet-beam emission point 11, red-beam-emission point 21, and infrared-beam-emission point 31 in this order in the Y-direction.

Note that the positions of the red-beam-emission point 21 and infrared-beam-emission point 31 can be changed by changing the arrangement of the red semiconductor laser device 2 and infrared semiconductor laser device 3 on the blue-violet semiconductor laser device 1.

Fifth Embodiment

Figure 18:
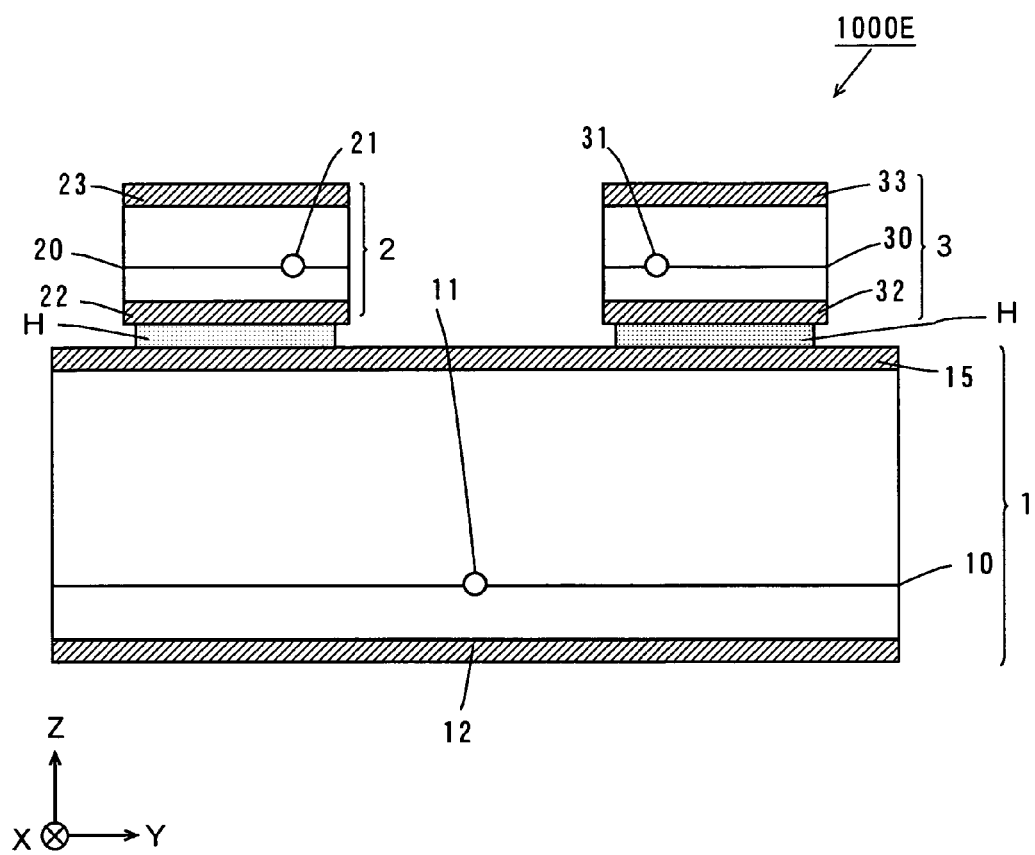
FIG. 18 is a schematic cross section showing an example of a semiconductor laser apparatus according to a fifth embodiment.

FIG. 18 is a schematic cross section showing an example of a semiconductor laser apparatus according to a fifth embodiment. In the following also, the X-, Y-, and Z-directions are defined as in FIG. 1.

The semiconductor laser apparatus 1001E according to the fifth embodiment differs in structure from the semiconductor laser apparatus 1000A according to the first embodiment as follows.

In this embodiment, the red semiconductor laser device 2 and infrared semiconductor laser device 3 are bonded onto an n-electrode 15 of the blue-violet semiconductor laser device 1, as shown in FIG. 18.

With this structure, the p-n junction surface 10 of the blue-violet semiconductor laser device 1 is spaced away from the p-n junction surface 20 of the red semiconductor laser device 2 and the p-n junction surface 30 of the infrared semiconductor laser device 3 in the Z-direction.

Consequently, the blue-violet-beam-emission point 11 of the blue-violet semiconductor 1 can be spaced away from the red-beam-emission point 21 and infrared-beam-emission point 31.

Sixth Embodiment

Figure 19:
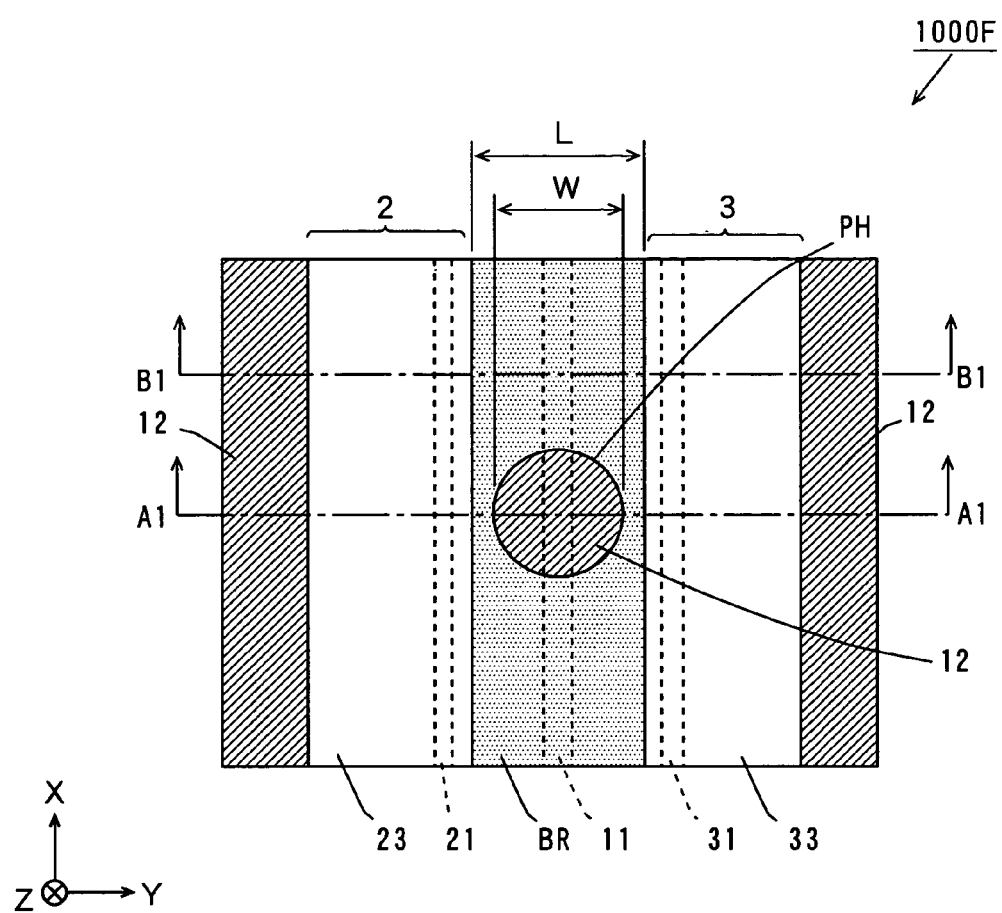
FIG. 19 is a schematic cross section showing an example of a semiconductor laser apparatus according to a sixth embodiment.

FIG. 19 is a schematic top view showing an example of a semiconductor laser apparatus according to a sixth embodiment. FIG. 20(a) shows a schematic cross section of the semiconductor laser apparatus 1000F of FIG. 19 along the line A1-A1, and FIG. 20(b) shows a schematic cross section of the semiconductor laser apparatus 1000F of FIG. 19 along the line B1-B1. In the following also, the X-, Y-, and Z-directions are defined as in FIG. 1.

The semiconductor laser apparatus 1000F according to the sixth embodiment differs in structure and method of fabrication from the semiconductor laser apparatus 1000A according to the first embodiment as follows.

As shown in FIG. 19 and FIGS. 20(a) and 20(b), the semiconductor laser apparatus 1000F according to this embodiment differs from the semiconductor laser apparatus 1000A according to the first embodiment in the structures of the red semiconductor laser device 2 and infrared semiconductor laser device 3 that are bonded onto the blue-violet semiconductor laser device 1.

The semiconductor layer 2t of the red semiconductor laser device 2 and the semiconductor layer 3t of the infrared semiconductor laser device 3 are connected through a connected portion BR. The connected portion BR is provided with a circular-shaped aperture PH between the red semiconductor laser device 2 and the infrared semiconductor laser device 3. The diameter W of this aperture PH is smaller than the distance L between the semiconductor layers $2t$ and $3t$.

The connected portion BR may include a portion of the semiconductor layer $2t$ of the red semiconductor laser device 2 or a portion of the semiconductor layer $3t$ of the infrared semiconductor laser device 3. The connected portion BR may, for example, act as a current blocking layer that restricts flow of current (which corresponds to e.g. the insulating films 210, 310 in FIG. 8 and FIG. 9) or as a p-type contact layer in each of the red semiconductor laser device 2 and infrared semiconductor laser device 3.

Figure 20:
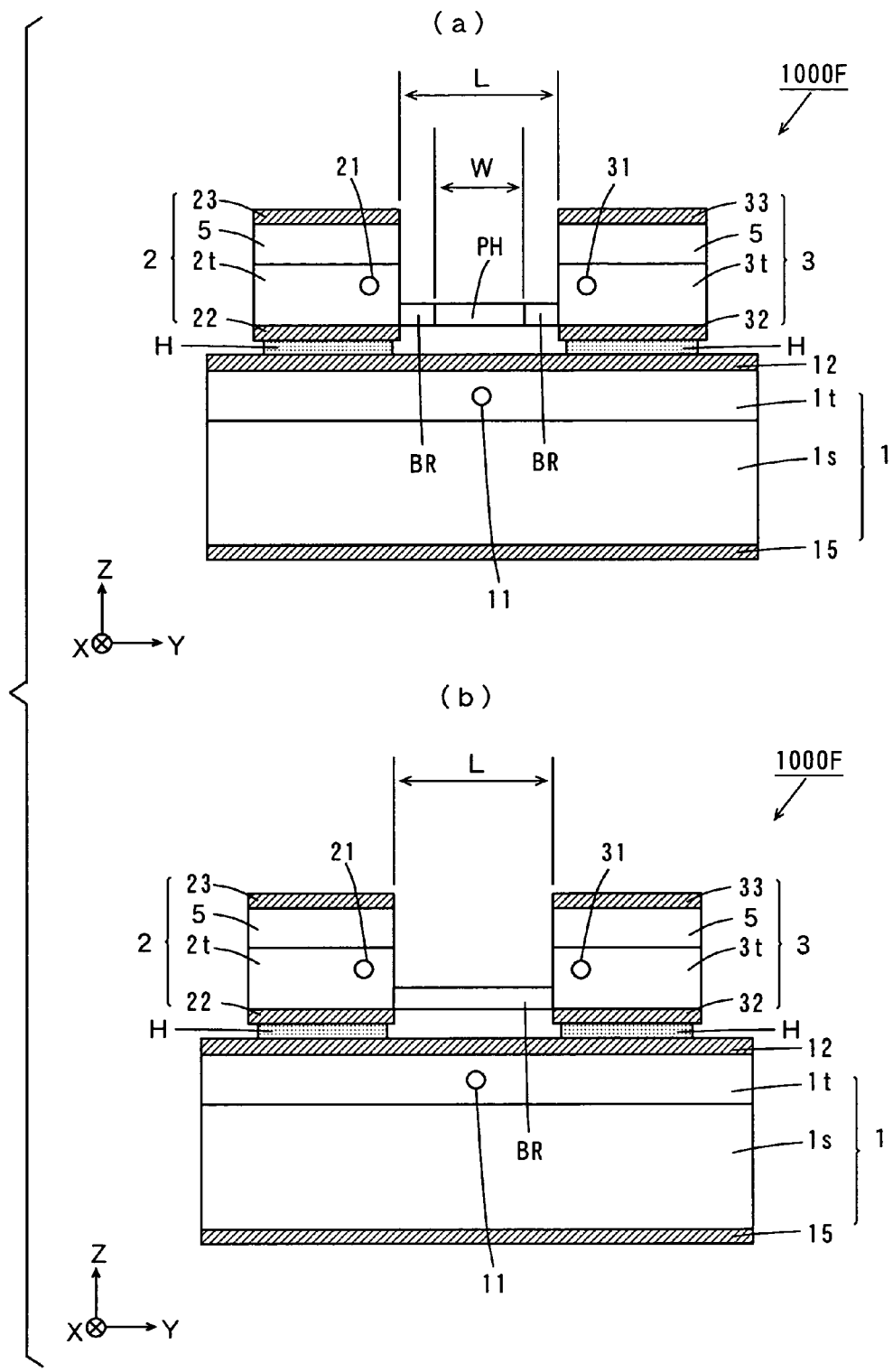
FIGS. 20(a) and 20(b) are schematic cross sections showing the semiconductor laser apparatus of FIG. 19 along the line A1-A1 and the line B1-B1, respectively.

FIG. 21 is a schematic cross section of the semiconductor laser apparatus 1000F of FIG. 19 and FIG. 20 when assembled on a heat sink. When the semiconductor laser apparatus of FIG. 19 and FIG. 20 is used in an optical pick up apparatus, the semiconductor laser apparatus 1000F is mounted on the heat sink 500, as shown in FIG. 21. Then, using wires 1W, 2Wb, 3Wb, 4Wa, the p-electrodes 12, 22, 32 and the n-electrodes 23, 33, 15 are wired. This enables driving each of the blue-violet semiconductor laser device 1, red semiconductor laser device 2, and infrared semiconductor laser device 3 independently.

In this embodiment, the p-electrode 12 which is formed on one surface of the blue-violet semiconductor laser device 1 is exposed through the aperture PH formed in the connected portion BR, as shown in FIG. 19 and FIG. 20.

This allows for wire bonding of the p-electrode 12 of the blue-violet semiconductor laser device 1 through the aperture PH of the connected portion BR. In this manner, the p-electrode 12 that is common among the blue-violet semiconductor laser device 1, red semiconductor laser device 2, and infrared semiconductor laser device 3 can be wire bonded from the same side as the n-electrodes 23, 33 of the red semiconductor laser device 2 and infrared semiconductor laser device 3. This results in improved wiring flexibility.

While the aperture PH has a circular shape in this embodiment, the shape of the aperture PH is not limited in particular. The aperture PH may have other shapes, including a square or triangular shape, as far as it is formed between the red semiconductor laser device 2 and the infrared semiconductor laser device 3.

Seventh Embodiment

Figure 22:
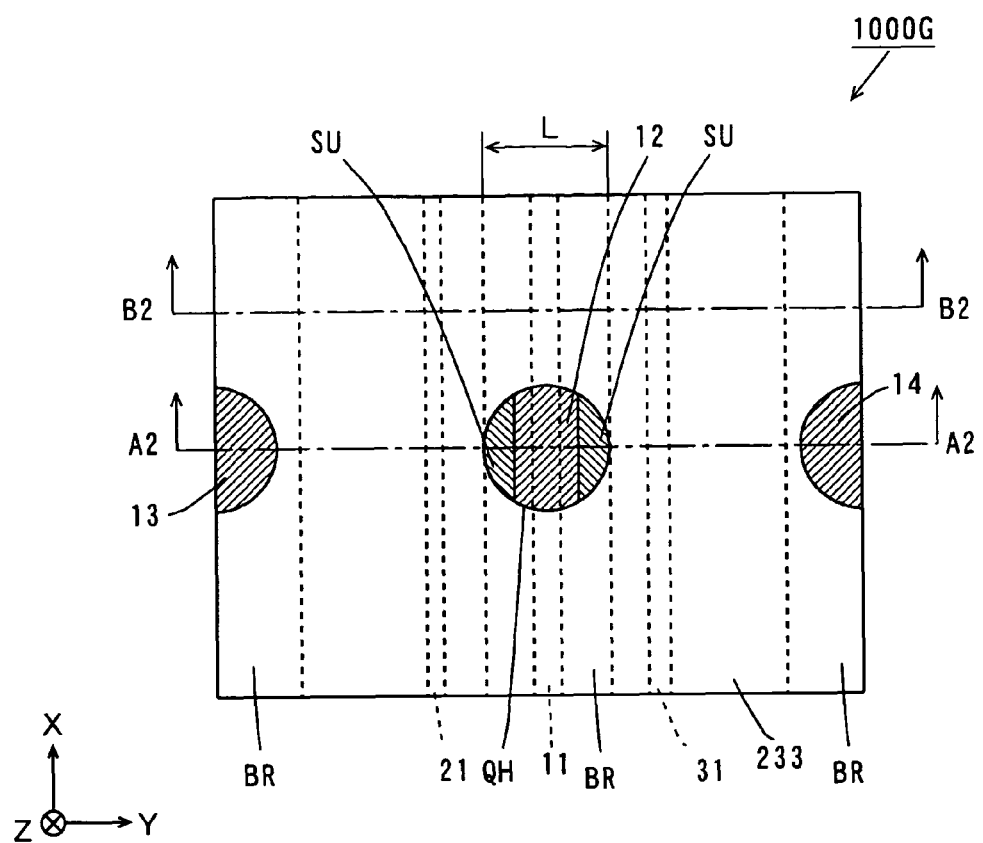
FIG. 22 is a schematic top view showing an example of a semiconductor laser apparatus according to a seventh embodiment.

FIG. 22 is a schematic top view showing an example of a semiconductor laser apparatus according to a seventh embodiment. FIG. 23(a) shows a schematic cross section of the semiconductor laser apparatus 1000G of FIG. 22 along the line A2-A2. FIG. 23(b) shows a schematic cross section of the semiconductor laser apparatus 1000G of FIG. 22 along the line B2-B2 In the following also, the X-, Y-, and X-directions are defined as in FIG. 1.

The semiconductor laser apparatus 1000G according to the seventh embodiment differs in structure and method of fabrication from the semiconductor laser apparatus 1000A according to the first embodiment as follows.

The semiconductor laser apparatus 1000G according to this embodiment differs from the semiconductor laser apparatus 1000A according to the first embodiment in the structures of the red semiconductor laser device 2 and infrared semiconductor laser device 3.

As described previously, each of the blue-violet semiconductor laser device 1, red semiconductor laser device 2, and infrared semiconductor laser device 3 has a ridge portion. In FIGS. 23(a) and 23(b), the ridge portion Ri of the blue-violet semiconductor laser device 1 is shown.

As shown in FIG. 22 and FIGS. 23(a) and 23(b), an insulating film SU is formed on the semiconductor layer 1t of the blue-violet semiconductor laser device 1 except the upper surface of the ridge portion Ri. On the upper surfaces of the ridge portion Ri and insulating film SU, three p-electrodes 12, 13, 14 are formed at a distance from one another.

The p-electrode 12 of the blue-violet semiconductor laser device 1 is formed on a region including the upper surface of the ridge portion Ri. The p-electrode 13 is formed on one side of the p-electrode 12 while the p-electrode 14 is formed on the other side of the p-electrode 12 in the Y-direction.

A common substrate between the red semiconductor laser device 2 and the infrared semiconductor laser device 3 (i.e., n-GaAs substrate 50) is not separated. This results in integral formation of the red semiconductor laser device 2 and infrared semiconductor laser device 3 with a distance L between them. The red semiconductor laser device 2 and infrared semiconductor laser device 3 integrally formed on the common substrate will hereinafter be referred to as a monolithic red/infrared semiconductor laser device.

A common n-electrode 233 between the red semiconductor laser device 2 and infrared semiconductor laser device 3 is formed on the surface of the n-GaAs substrate 50. The red semiconductor laser device 2 and infrared semiconductor laser device 3 are connected through a connected portion BR that includes the common substrate (i.e., n-GaAs substrate 50). The connected portion BR is provided with a plurality of apertures QH between the red semiconductor laser device 2 and the infrared semiconductor laser device 3. Note that the connected portion BR may include a portion of the semiconductor layer 2t of the red semiconductor laser device 2 or a portion of the semiconductor layer 3t of the infrared semiconductor laser device 3. The connected portion BR may include the n-GaAs layer 201 and n-AlGaInP cladding layer 202 in FIG. 8 or the n-GaAs layer 301 and n-AlGaAs cladding layer 302 in FIG. 9, for example.

In this embodiment, the p-electrodes 12, 13, 14 formed on the blue-violet semiconductor laser device 1 are exposed through the plurality of apertures QH formed in the n-GaAs substrate 50.

In the blue-violet semiconductor laser device 1, the p-electrodes 12, 13, 14 are isolated from one another on the insulating film SU. This results in an electrical isolation among the p-electrode 12 of the blue-violet semiconductor laser device 1, p-electrode 22 of the red semiconductor laser device 2 which is bonded to the p-electrode 13, and the p-electrode 32 of the infrared semiconductor laser device 3 which is bonded to the p-electrode 14.

Figure 23:
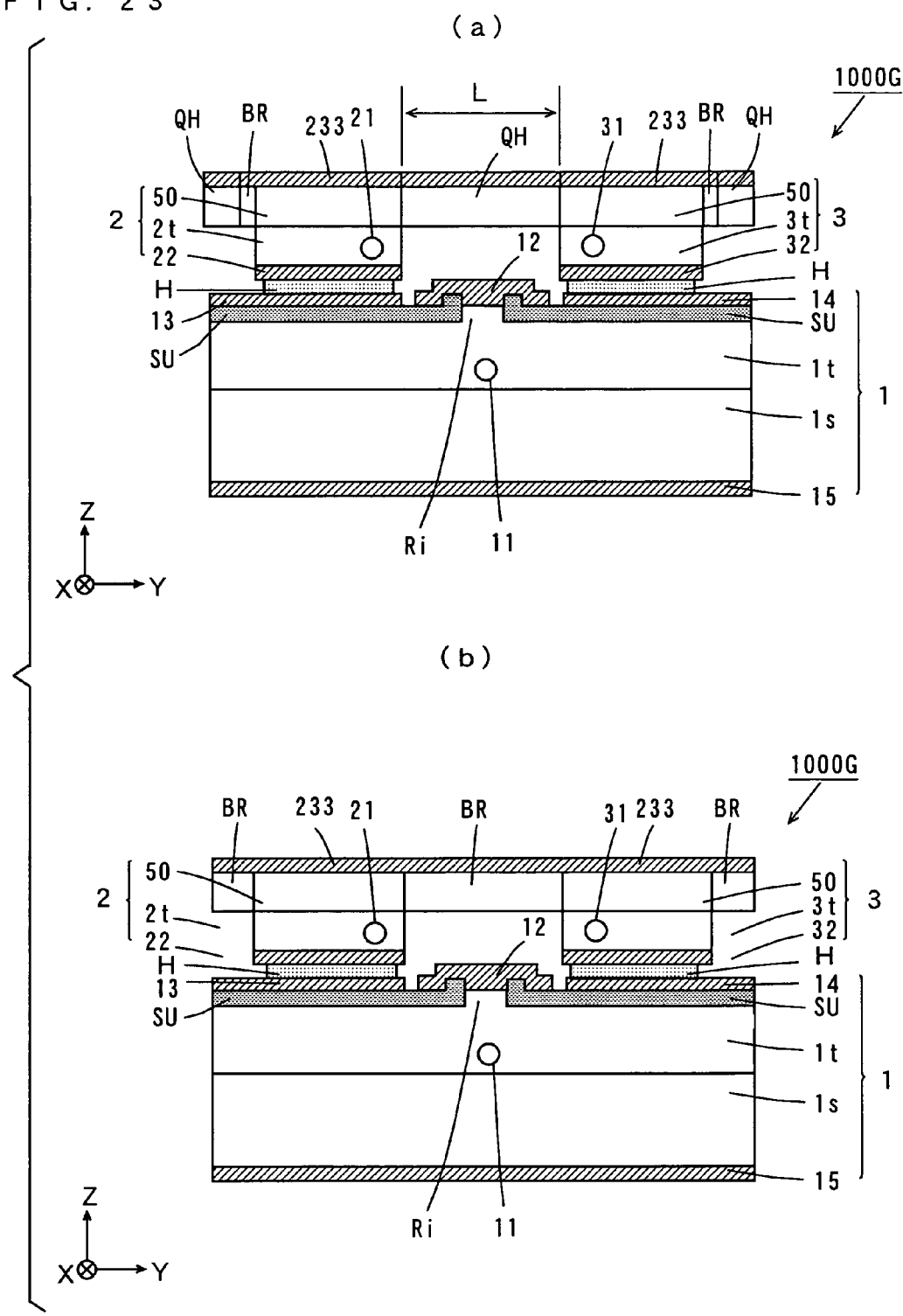
FIGS. 23(a) and 23(b) are schematic cross sections showing the semiconductor laser apparatus of FIG. 22 along the line A2-A2 and the line B2-B2, respectively.
Figure 24:
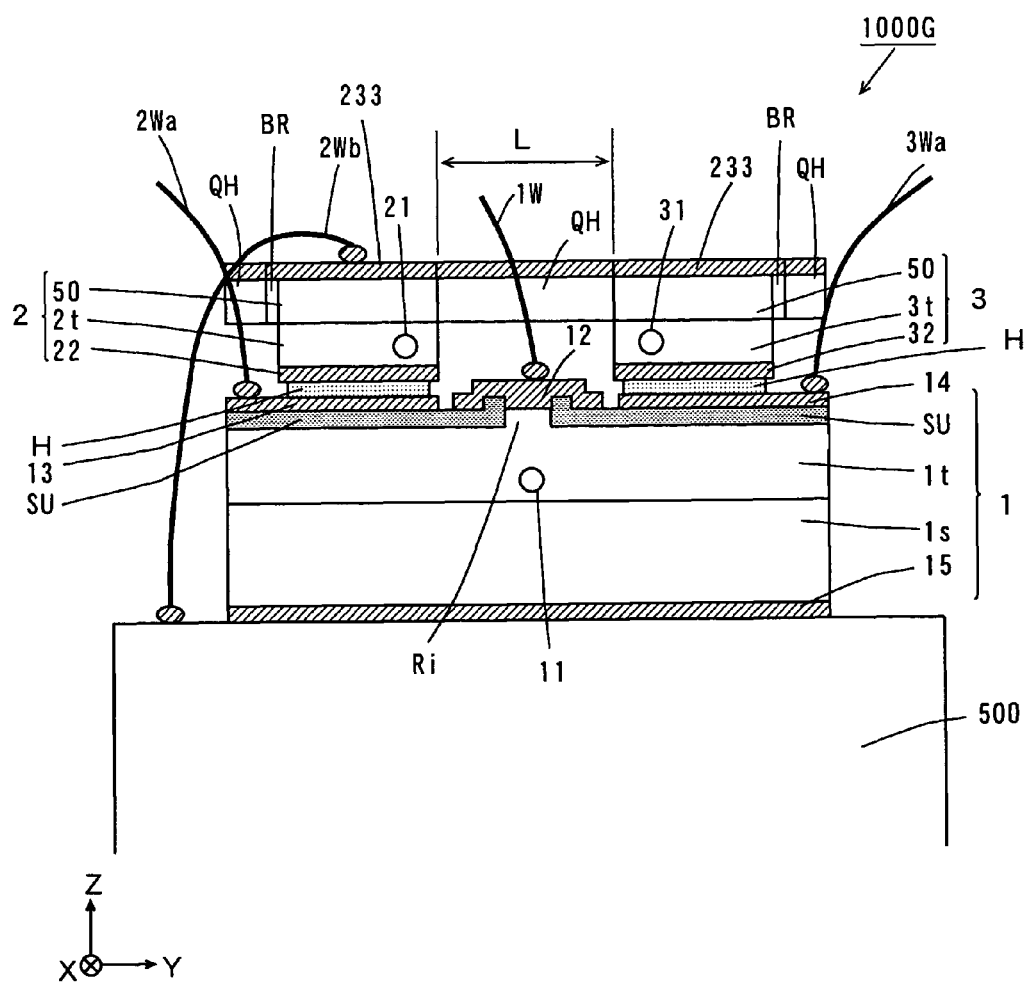
FIG. 24 is a schematic cross section of the semiconductor laser apparatus of FIG. 22 and FIG. 23 when assembled on a heat sink.

FIG. 24 is a schematic cross section of the semiconductor laser apparatus 1000G of FIG. 22 and FIG. 23 when assembled on a heat sink. When the semiconductor laser apparatus 100G of FIG. 22 and FIG. 23 is used in an optical pick up apparatus, the semiconductor laser apparatus 1000G is mounted on the heat sink 500, as shown in FIG. 24. Then, using wires 1W, 2Wa, 2Wb, 3Wa, the p-electrodes 12, 22, 32 and n-electrodes 233, 15 are wired.

More specifically, the n-electrode 15 is bonded to the upper surface of a stem 500. This results in an electrical connection between the n-electrode 15 and the stem 500.

The n-electrode 233 as the common electrode between the red semiconductor laser device 2 and the infrared semiconductor laser device 3 is electrically connected to the upper surface of the stem 500 through the wire 2Wb.

This makes the stem 500 a common n-electrode among the blue-violet semiconductor laser device 1, red semiconductor laser device 2, and infrared semiconductor laser device 3, resulting in a common-cathode connection.

The p-electrode 12 on the blue-violet semiconductor laser device 1 is connected to a drive circuit not shown through the wire 1W. The wire 1W is connected to the p-electrode 12 from above the semiconductor laser apparatus 1000G through the corresponding aperture QH of the n-GaAs substrate 50.

The p-electrode 13 on the blue-violet semiconductor laser device 1 is connected to the drive circuit not shown through the wire 2Wa. This results in an electrical connection between the p-electrode 22 of the red semiconductor laser device 2 and the drive circuit. The wire 2Wa is connected to the p-electrode 13 from above the semiconductor laser apparatus 1000G through the corresponding aperture QH of the n-GaAs substrate 50.

The p-electrode 14 on the blue-violet semiconductor laser device 1 is connected to the drive circuit not shown through the wire 3Wa. This results in an electrical connection between the p-electrode 32 of the infrared semiconductor laser device 3 and the drive circuit. The wire 3Wa is connected to the p-electrode 14 from above the semiconductor laser apparatus 1000G through the corresponding aperture QH of the n-GaAs substrate 50.

The blue-violet semiconductor laser device 1 can be driven by applying a voltage between the stem 500 and the wire 1W. The red semiconductor laser device 2 can be driven by applying a voltage between the stem 500 and the wire 2Wa. The infrared semiconductor laser device 3 can be driven by applying a voltage between the stem 500 and the wire 3Wa. In this manner, each of the blue-violet semiconductor laser device 1, red semiconductor laser device 2, and infrared semiconductor laser device 3 can be driven independently.

In this embodiment, the p-electrode 12 of the blue-violet semiconductor laser device 1, p-electrode 22 of the red semiconductor laser device 2 which is bonded to the p-electrode 13, and the p-electrode 32 of the infrared semiconductor laser device 3 which is bonded to the p-electrode 14 are electrically isolated from one another, as described previously.

This allows an arbitrary voltage to be applied to each of the p-electrode 12 of the blue-violet semiconductor laser device 1, p-electrode 22 of the red semiconductor laser device 2, and p-electrode 32 of the infrared semiconductor laser device 3. Consequently, arbitral selection of a driving system for each of the blue-violet semiconductor laser device 1, red semiconductor laser device 2, and infrared semiconductor laser device 3 is possible.

Moreover, the p-electrodes 12, 13, 14 formed on the blue-violet semiconductor laser device 1 are exposed outside through the respective apertures QH of the n-GaAs substrate 50.

This allows for wire bonding of the p-electrodes 12, 13, 14 on the blue-violet semiconductor laser device 1 through the respective apertures QH of the n-GaAs substrate 50.

In this manner, the p-electrode 12 of the blue-violet semiconductor laser device 1, p-electrode 22 of the red semiconductor laser device 2, and p-electrode 23 of the infrared semiconductor laser device 3 can be wire bonded from the same side as then-electrode 233 of the red semiconductor laser device 2 and infrared semiconductor laser device 3. This results in improved wiring flexibility.

While the aperture QH has a circular shape in this embodiment, the shape of the aperture QH is not limited in particular. The aperture QH may have other shapes, including a square or triangular shape, as far as it is formed between the red semiconductor laser device 2 and the infrared semiconductor laser device 3.

Further, in the fabrication of semiconductor laser apparatuses 1000G according to this embodiment, the formation of satisfactory scribe lines is possible during a step of cleaving a plurality of semiconductor laser apparatuses 1000G, as will now be described in detail.

FIG. 25(a) is a schematic diagram showing scribe lines that are formed during the fabrication of semiconductor laser apparatuses 1000G according to the seventh embodiment. FIG. 25(b) is a schematic diagram showing scribe lines that are formed during the fabrication of semiconductor laser apparatuses 1000X, each of which has an n-GaAs substrate 50 separated between the red semiconductor laser device 2 and the infrared semiconductor laser device 3. Note that electrodes are not shown in FIGS. 25(a) and 25(b).

In cleaving the n-GaN substrate (n-GaN wafer) 1s and the n-GaAs substrate (n-GaAs wafer) 50 having a plurality of semiconductor laser apparatuses 1000G formed thereon, scribe lines along the Y-direction is formed, for example as indicated by the lines D2-D2 in FIG. 25(a). A scribe line along the X-direction is then formed as indicated by the line D1-D1 in FIG. 25(a).

The n-GaN substrate 1s and n-GaAs substrate 50 are cleaved into bars along these scribe lines, and further cut into chips, resulting in separate semiconductor laser apparatuses 1000G.

In this case, the surface of the n-GaAs substrate 50 is flat on the scribe lines indicated by the lines D2-D2. This allows uniform scribe lines to be easily formed across the entire n-GaAs substrate 50. This leads to satisfactory cleavages along the Y-direction, resulting in flat cleavage planes. As a result, good cavity facets can be easily obtained.

Where the surface of the n-GaAs substrate 50 is flat on the lines D2-D2 as in the case of FIG. 25(a), the formation of scribe cuts only on the ends of a piece of the n-GaAs substrate 50 along each line D2-D2 allows wafer cleavage to be easily accomplished.

For comparison, semiconductor laser apparatuses 1000X (corresponding to the first embodiment to fifth embodiment) each having an n-GaAs substrate 50 separated between the red semiconductor laser device 2 and the infrared semiconductor laser device 3 on the blue-violet semiconductor laser device 1 will be described with reference to FIG. 25(b).

In this case, scribe lines indicated by the lines D2-D2 are formed on a surface with projections and depressions. This may result in deep cuts in ends TA of each of a plurality of n-GaAs substrates 50 in the Y-direction. Such deep cuts in the ends TA makes it difficult to provide good cavity facets.

Moreover, in the semiconductor laser apparatuses 1000X of FIG. 25(b), the n-GaAs substrates 50 are separated in the Y-direction between each red semiconductor laser device 2 and infrared semiconductor laser device 3. This necessitates the formation of scribe lines (or scribe cuts) in all of the separated n-GaAs substrates 50 in order to effect cleavage of all of the semiconductor laser apparatuses 1000X.

Note that in the fabrication of the semiconductor laser apparatuses 1000X in FIG. 25(b), uniform and satisfactory scribe lines may be obtained e.g. by forming scribe lines in the n-GaAs substrate 50 along the Y-direction prior to the step of separating the n-GaAs substrate 50 as shown in FIG. 5(e) or FIG. 14. However, such an n-GaAs substrate 50 with scribe lines being formed can be easily cracked when subjected to processing at subsequent steps (for example the steps of FIG. 5(e) and FIG. 5(f)), resulting in a decreased yield.

In this embodiment, the n-GaAs substrate 50, i.e., the common substrate between the red semiconductor laser device 2 and the infrared semiconductor laser device 3, is not separated. This allows the formation of scribe lines or scribe cuts in the n-GaAs substrate 50 to be accomplished easily and satisfactorily. This leads to flat and satisfactory cleavage planes upon cleavage of the plurality of semiconductor laser apparatuses 1000G. As a result, satisfactory cavity facets can be obtained.

Subsequent to laminating the n-GaN substrate 1s and n-GaAs substrate 50, the n-GaAs substrate 50 is thinned by wet etching.

Note that the n-GaAs sbustrate 50 is easily wet-etched while the n-GaN substrate 1s is not. This facilitates control of the amount of etching in the n-GaAs substrate 50.

In this embodiment, the n-GaN substrate 1s may be thinned by polishing or other processes after the above-described wet-etching of the n-GaAs substrate 50. In this case, the n-GaN substrate 1s having higher hardness is made thinner than the n-GaAs substrate 50. This facilitates cleavage of the semiconductor laser apparatuses 1000G while providing satisfactory cleavage planes.

In the foregoing first embodiment to seventh embodiment, the n-GaN substrate is corresponds to a first substrate, the laser beam having a wavelength of approximately 400 nm corresponds to a light beam having a first wavelength, the semiconductor layer 1t corresponds to a first semiconductor layer, and the blue-violet semiconductor laser device 1 corresponds to a first semiconductor laser device.

Each of the n-GaAs contact layer 5, n-GaAs substrate 50 and n-GaAs substrate 5X corresponds to a second substrate, the laser beam having a wavelength of approximately 650 nm corresponds to a light beam having a second wavelength, the semiconductor layer 2t corresponds to a second semiconductor layer, and the red semiconductor laser device 2 corresponds to a second semiconductor laser device.

Each of the n-GaAs contact layer 5, n-GaAs substrate 50, and n-GaAs substrate 5X corresponds to a third substrate, the light beam having a wavelength of approximately 780 nm corresponds to a light beam having a third wavelength, the semiconductor layer 3t corresponds to a third semiconductor layer, and the infrared semiconductor laser device 3 corresponds to a third semiconductor laser device.

The p-electrode 12 of the blue-violet semiconductor laser device 1 corresponds to a first electrode, the n-electrode 23 of the red semiconductor laser device 2 corresponds to a second electrode, and the n-electrode 33 of the infrared semiconductor laser device 3 corresponds to a third electrode.

The n-electrode 15 of the blue-violet semiconductor laser device 1 corresponds to a fourth electrode, the p-electrode 22 of the red semiconductor laser device 2 corresponds to a fifth electrode, and the p-electrode 32 of the infrared semiconductor laser device 3 corresponds to a sixth electrode.

The insulating film SU corresponds to an insulating layer, each of the n-GaAs substrate 50, n-GaAs substrate 5X, n-GaAs contact layer 5, and the common connected portion BR corresponds to a connected portion, and each of the apertures PH and QH corresponds to a aperture.

What is claimed is:

1. A semiconductor laser apparatus comprising:
    a first semiconductor laser device having a first semiconductor layer that emits a light beam having a first wavelength;
    a second semiconductor laser device having a second semiconductor layer that emits a light beam having a second wavelength; and
    a third semiconductor laser device having a third semiconductor layer that emits a light beam having a third wavelength, wherein
    at least one of said first, second, and third wavelengths is different from another wavelength,
    said first semiconductor laser device has a first electrode on said first semiconductor layer,
    said second semiconductor laser device and said third semiconductor laser device are bonded onto said first semiconductor layer—of said first semiconductor laser device such that at least a portion of said first electrode of said first semiconductor laser device is exposed between said second semiconductor laser device and said third semiconductor laser device,
    said second semiconductor laser device has a fifth electrode on said second semiconductor layer,
    said third semiconductor laser device has a sixth electrode on said third semiconductor layer,
    said first semiconductor laser device further has an insulating film formed on said first semiconductor layer except a region on a light-beam-emission-point of said first semiconductor laser device, and a seventh electrode and an eighth electrode formed on said insulating film that are electrically isolated from said first electrode and are also electrically isolated from each other,
    said first electrode is electrically connected to said first semiconductor layer in the region on the light-beam-emission-point of said first semiconductor laser device,
    said seventh electrode and said fifth electrode face each other while being electrically connected to each other, and
    said eighth electrode and said sixth electrode face each other while being electrically connected to each other.

2. The semiconductor laser apparatus according to claim 1, wherein
    a light-beam-emission point of said third semiconductor laser device is closer to the side of said light-beam-emission point of said first semiconductor laser device than a central position of said third semiconductor laser device in a direction that is parallel to said p-n junction surface of said first semiconductor laser device and is vertical to the direction in which said light beam having said first wavelength is emitted.

3. The semiconductor laser apparatus according to claim 1, wherein
    said first semiconductor laser device has said first semiconductor layer on a first substrate.

4. The semiconductor laser apparatus according to claim 1, wherein
    said second semiconductor laser device has said second semiconductor layer on a second substrate, and
    said third semiconductor laser device has said third semiconductor layer on a third substrate.

5. The semiconductor laser apparatus according to claim 3, wherein
    said first semiconductor laser device has a fourth electrode on said first substrate.

6. The semiconductor laser apparatus according to claim 1, wherein
    said second semiconductor laser device and said third semiconductor laser device include a connected portion, through which said second semiconductor laser device and said third semiconductor laser device are connected with each other, and
    said connected portion has an aperture in a vertical direction to a surface of said first electrode such that at least a portion of said first electrode of said first semiconductor laser device is exposed.

7. The semiconductor laser apparatus according to claim 3, wherein
    said second semiconductor laser device has said second semiconductor layer on a second substrate, and said third semiconductor laser device has said third semiconductor layer on a third substrate, and
    at least either, of said second or third substrates is made of a material different from that of said first substrate.

8. The semiconductor laser apparatus according to claim 1, wherein
    said first electrode is formed on said first semiconductor layer,
    said second semiconductor laser device has a second electrode on a surface opposite to a junction with said first semiconductor laser device, and
    said third semiconductor laser device has a third electrode on a surface opposite to a junction with said first semiconductor laser device.

9. The semiconductor laser apparatus according to claim 8, wherein
    said second semiconductor laser device has said second semiconductor layer on a second substrate, while said third semiconductor laser device has said third semiconductor layer an a third substrate,
    said second electrode of said second semiconductor laser device is formed on said second substrate, while said third electrode of said third semiconductor laser device is formed on said third substrate, and
    said second semiconductor layer of said second semiconductor laser device and said third semiconductor layer of said third semiconductor laser device are bonded onto said first semiconductor layer of said first semiconductor laser device.

10. The semiconductor laser apparatus according to claim 1, wherein
    said second semiconductor laser device and said third semiconductor laser device are isolated from each other such that at least a portion of said first electrode is exposed.

11. The semiconductor laser apparatus according to claim 1, wherein
    said light-beam-emission point of said first semiconductor laser device overlaps with a space formed between said second semiconductor laser device and said third semiconductor laser device.

12. The semiconductor laser apparatus according to claim 1, wherein
    said first semiconductor layer is made of a nitride-based semiconductor.

13. The semiconductor laser apparatus of claim 3, wherein a wire is connected through a space formed between said second semiconductor laser device and said third semiconductor laser device.

14. The semiconductor laser apparatus of claim 9, wherein a wire is connected through a space formed between said second semiconductor laser device and said third semiconductor laser device.

15. The semiconductor laser apparatus of claim 10, wherein
a wire is connected through a space formed between said second semiconductor laser device and said third semiconductor laser device.

16. The semiconductor laser apparatus of claim 1, wherein
said seventh electrode and said fifth electrode are electrically connected to each other by a solder film, and
said eighth electrode and said sixth electrode are electrically connected to each other by a solder film.

17. The semiconductor laser apparatus of claim 1, wherein
a light-beam-emission point of said second semiconductor laser device is closer to the side of the light-beam-emission point of said first semiconductor laser device than a central position of said second semiconductor laser device in a direction that is parallel to a p-n-junction surface of said first semiconductor laser device and is vertical to a direction in which said light beam having said first wavelength is emitted.

* * * * *